(12) United States Patent
Satou

(10) Patent No.: US 9,296,198 B2
(45) Date of Patent: Mar. 29, 2016

(54) SCREEN PRINTING APPARATUS

(75) Inventor: Toshimichi Satou, Shizuoka (JP)

(73) Assignee: YAMAHA HATSUDOKI KABUSHIKI KAISHA, Shizuoka-ken (JP)

(*) Notice: Subject to any disclaimer, the term of this patent is extended or adjusted under 35 U.S.C. 154(b) by 226 days.

(21) Appl. No.: 14/127,461

(22) PCT Filed: Jun. 21, 2011

(86) PCT No.: PCT/JP2011/003526
§ 371 (c)(1),
(2), (4) Date: Dec. 18, 2013

(87) PCT Pub. No.: WO2012/176230
PCT Pub. Date: Dec. 27, 2012

(65) Prior Publication Data

US 2014/0116274 A1    May 1, 2014

(51) Int. Cl.
| | |
|---|---|
| B41F 15/08 | (2006.01) |
| B41F 15/26 | (2006.01) |
| H05K 3/12 | (2006.01) |
| H05K 3/34 | (2006.01) |

(52) U.S. Cl.
CPC ............ *B41F 15/0881* (2013.01); *B41F 15/08* (2013.01); *B41F 15/26* (2013.01); *H05K 3/1216* (2013.01); *H05K 3/3484* (2013.01)

(58) Field of Classification Search
CPC .. B41F 15/08; B41F 15/0813; B41F 15/0818; B41F 15/0881; B41F 15/12; B41F 15/14; B41F 15/26; H05K 3/1233; H05K 3/1216; H05K 2203/163

USPC .................................. 101/114, 123, 126, 129
See application file for complete search history.

(56) References Cited

U.S. PATENT DOCUMENTS

| | | | |
|---|---|---|---|
| 2008/0250951 | A1 | 10/2008 | Klauser et al. |
| 2009/0133595 | A1 | 5/2009 | Yamasaki et al. |
| 2009/0174747 | A1 | 7/2009 | Sato |
| 2009/0199729 | A1 | 8/2009 | Aiba |
| 2010/0242755 | A1 | 9/2010 | Nagao |
| 2012/0085253 | A1 | 4/2012 | Nagao |

(Continued)

FOREIGN PATENT DOCUMENTS

| | | |
|---|---|---|
| CN | 101032880 A | 9/2007 |
| CN | 101304879 A | 11/2008 |
| CN | 101489791 A | 7/2009 |

(Continued)

OTHER PUBLICATIONS

International Search Report; PCT/JP2011/003526; Jul. 19, 2011.

(Continued)

*Primary Examiner* — Leslie J Evanisko
(74) *Attorney, Agent, or Firm* — Studebaker & Brackett PC

(57) ABSTRACT

A screen printing apparatus provided with a print executing part, a substrate loading part, a substrate unloading part and a transferring and holding device. The transferring and holding device includes a clamp unit. The transferring and holding device is configured to transfer the substrate to a print executing position upon holding the substrate with the clamp unit so that the print executing part enables performing printing at a substrate standby position. A substrate recognition camera enables imaging in the course of the transfer of the substrate.

7 Claims, 16 Drawing Sheets

(56) References Cited

U.S. PATENT DOCUMENTS

| | | |
|---|---|---|
| 2012/0085254 A1 | 4/2012 | Nagao |
| 2012/0138664 A1 | 6/2012 | Sumioka |

FOREIGN PATENT DOCUMENTS

| | | |
|---|---|---|
| JP | 01-232046 A | 9/1989 |
| JP | 03-020099 A | 1/1991 |
| JP | 06-305111 A | 11/1994 |
| JP | 10-076631 A | 3/1998 |
| JP | 2000-103033 A | 4/2000 |
| JP | 2003-211631 A | 7/2003 |
| JP | 2008-114522 A | 5/2008 |
| JP | 2008-307719 A | 12/2008 |
| JP | 2009-070867 A | 4/2009 |
| JP | 2010-179628 A | 8/2010 |
| JP | 2011-131489 A | 7/2011 |

OTHER PUBLICATIONS

Japanese Office Action, "Notice of Reasons for Refusal", JP2009-292782, Jul. 30, 2013.

The extended European search report issued by the European Patent Office on Jun. 19, 2015, which corresponds to European Patent Application No. 11868101.4-1806 and is related to U.S. Appl. No. 14/127,461.

SCREEN PRINTING APPARATUS

CROSS REFERENCE TO RELATED APPLICATIONS

This application claims benefit of priority to International Patent Application No. PCT/JP2011/003526 filed on Jun. 21, 2011, the entire content of which is incorporated herein by reference.

TECHNICAL FIELD

The present disclosure relates to a screen printing apparatus which prints solder cream, conductive paste or the like on a substrate, as a preprocessing for mounting parts on the substrate of a printed wiring board (PWB) or the like.

BACKGROUND

A screen printing apparatus is built into the manufacturing line of a printed circuit board (PCB). The apparatus prints conductive paste or the like on a substrate that is transferred from the upstream side and delivers the substrate to the component mounting device on the downstream side.

For example, as disclosed in Japanese Patent Publication No. 2682145, this kind of screen printing apparatus is configured to receive a substrate one by one by the printing unit that performs print processing thereto, and the apparatus sends the printed substrate to the component mounting device. Moreover, in recent years, as disclosed, for example, in Japanese Patent Application Publication No. 2009-70867, an apparatus that comprises two parallel printing units has been developed. The respective printing units individually receive substrates from the upstream side and perform print processing. Then the respective printing units individually deliver the substrates to the downstream side. Such operations have been achieved by using a so-called dual transfer-type component mounting device in which two substrate transfer lines are provided in one apparatus, and the mounting of components are carried out simultaneously (in parallel) with each transfer line. The aim is to make the printing and component mounting processes efficient by coupling the screen printing apparatus and the component mounting device.

Meanwhile, in order to prevent the substrate and the screen mask from overlapping, a screen printing apparatus is configured to fasten the substrate loaded on the substrate table with a clamp device or the like at the print executing position or below the mask in the vicinity thereof; detect a position gap of the substrate by an image capturing; and correct the position of the substrate table upon overlapping the substrate with the mask at the print executing position. In the foregoing case, since there is a lower volume of the mask in a space where the substrate is raised for the overlap, it is difficult to fasten the camera in that space. Therefore, such an apparatus, as described for example in Japanese Patent Publication No. 2682145, is provided with a camera on the side position of the mask. The apparatus is configured such that the substrate is loaded on the substrate table, the clamped substrate is moved once from the lower position of the mask to the camera position after the substrate is loaded on the substrate table, the imaging of the substrate is then performed, the substrate is returned again to the print executing position, and printing is then performed after overlapping the substrate with the mask. Meanwhile, the apparatus described in Japanese Patent Application Publication No. 2009-70867 is provided with a movable camera. The apparatus is configured such that the camera is temporarily placed between the clamped substrate and the mask at the print executing position in order to image the substrate, and the camera is withdrawn to the side position of the mask, after completing the imaging.

In both of the foregoing configurations, however, a relatively long time is required for the substrate recognition after the substrate is loaded, because the substrate or the camera should be moved between the lower position of the mask and the side position of the mask. Accordingly, this is one impediment of improving the throughput (shortening the cycle time) in a printer.

Meanwhile, in the screen printing apparatus of Japanese Patent Application Publication No. 2009-70867, the substrate loading parts and the substrate unloading parts are offset in a direction (Y axis direction) that is orthogonal to the substrate transfer direction (X axis direction), and a stage for supporting and fastening the substrate is configured to move in the Y axis direction. This is because of the need for the substrate unloading parts to be close to each other so as to interlock them with two substrate transfer lines on a component mounting device side of the substrate transfer lines on the component mounting device.

In this apparatus, however, since the stage has to receive a substrate at a position (receiving position) corresponding to the substrate loading part and the stage has to move to a position (sending position) corresponding to the substrate unloading part to unload the substrate after printing, the stage is unable to receive a subsequent substrate while unloading the preceding substrate. Therefore, this is also an impediment to improving the throughput.

SUMMARY

The present disclosure was devised in view of the foregoing circumstances, and an object of this disclosure is to provide a screen printing apparatus capable of improving the throughput.

In order to attain the foregoing object, the screen printing apparatus of the present disclosure comprises a print executing part that is placed between a substrate loading position and a substrate unloading position aligned in a specific direction. The printing executing part performs screen printing on a substrate using a screen mask. A transferring and holding means transfers the substrate loaded from the substrate loading position to a print executing position at which the print executing part is enabled to perform printing. The transferring and holding means holds the substrate during the printing. A substrate imaging means images the substrate held by the transferring and holding means before printing is performed by the print executing part. The transferring and holding means receives the substrate at a specific position that is closer to a substrate loading position side than the print executing position, and the transferring and holding means transfers the substrate from the specific position to the print executing position in advance upon holding the substrate in a state such that the substrate is printable by the print executing part. The substrate imaging means is disposed at a position where the substrate imaging means enables imaging of the substrate in the course of the transfer of the substrate from the specific position to the print executing position by the transferring and holding means.

According to the foregoing screen printing apparatus, the substrate is transferred from the specific position to the print executing position in a state that the substrate is held in advance by the transferring and holding means at the specific position that is closer to a substrate loading position side than the print executing position so that the substrate is printable by the print executing part. Then, a picture of the substrate is taken by the substrate imaging means while the substrate is being transferred from the specific position to the print executing position. According to the aforementioned screen printing apparatus, an independent process for imaging the substrate is not required. Rather, the transfer of the substrate to the print executing position and the imaging of the substrate are performed in parallel. Therefore, the cycle time can be effectively shortened in comparison to a conventional apparatus, or the like, which requires an independent process for imaging the substrate. Such an apparatus or the like loads a substrate at a print executing position and fixes the substrate with a clamp device, and thereafter moves the substrate, together with the clamp device, to the imaging position on the print executing position side, and thereby images the substrate. Accordingly, the present disclosure can improve the throughput and contribute to the improvement in the productivity of printed circuit boards.

DETAILED DESCRIPTION

The preferred embodiments of the present disclosure are now explained in detail with reference to the appended drawings.

Figure 1:
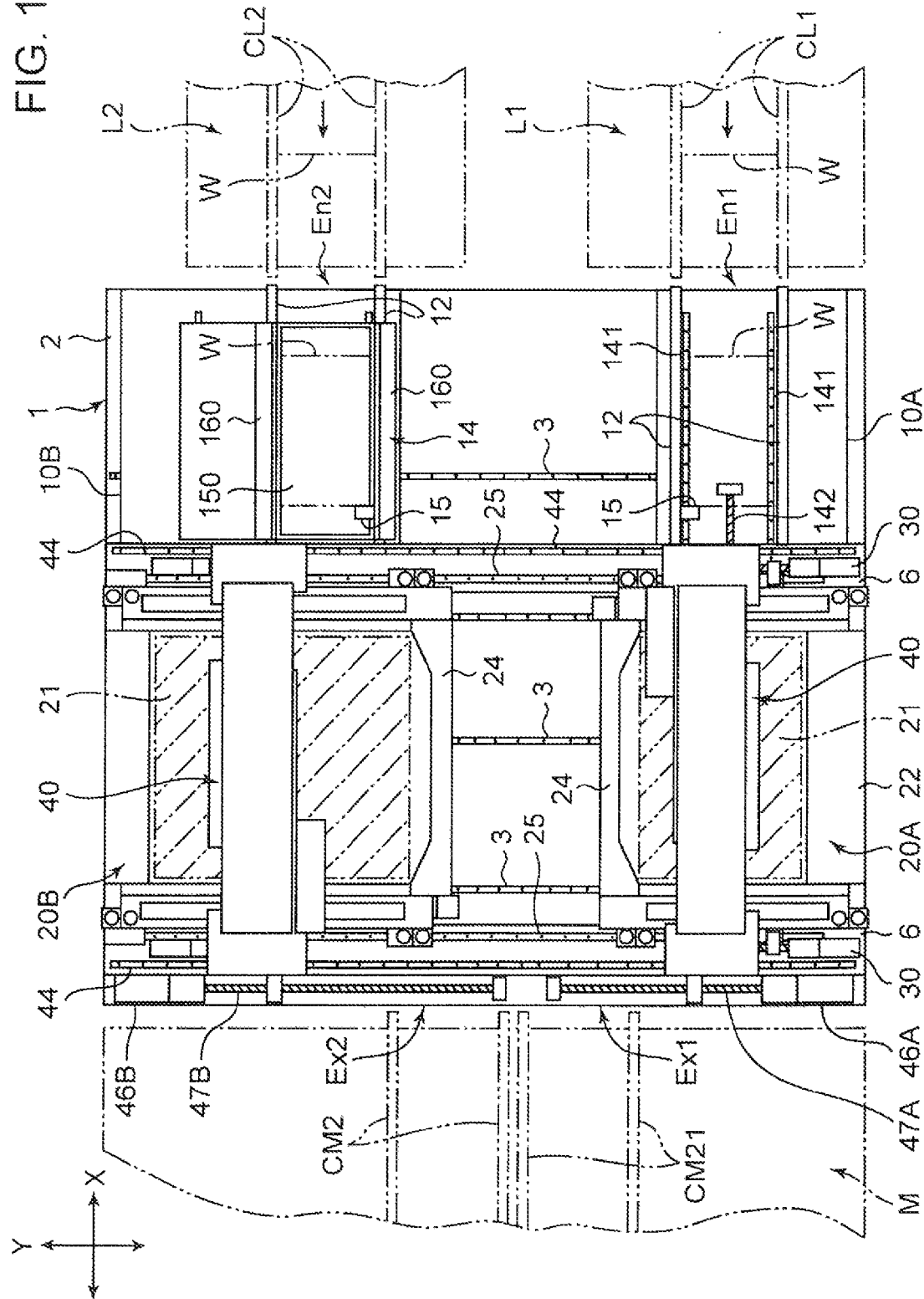
FIG. 1 a plan view showing the first embodiment of the screen printing apparatus according to the present disclosure.
Figure 2:
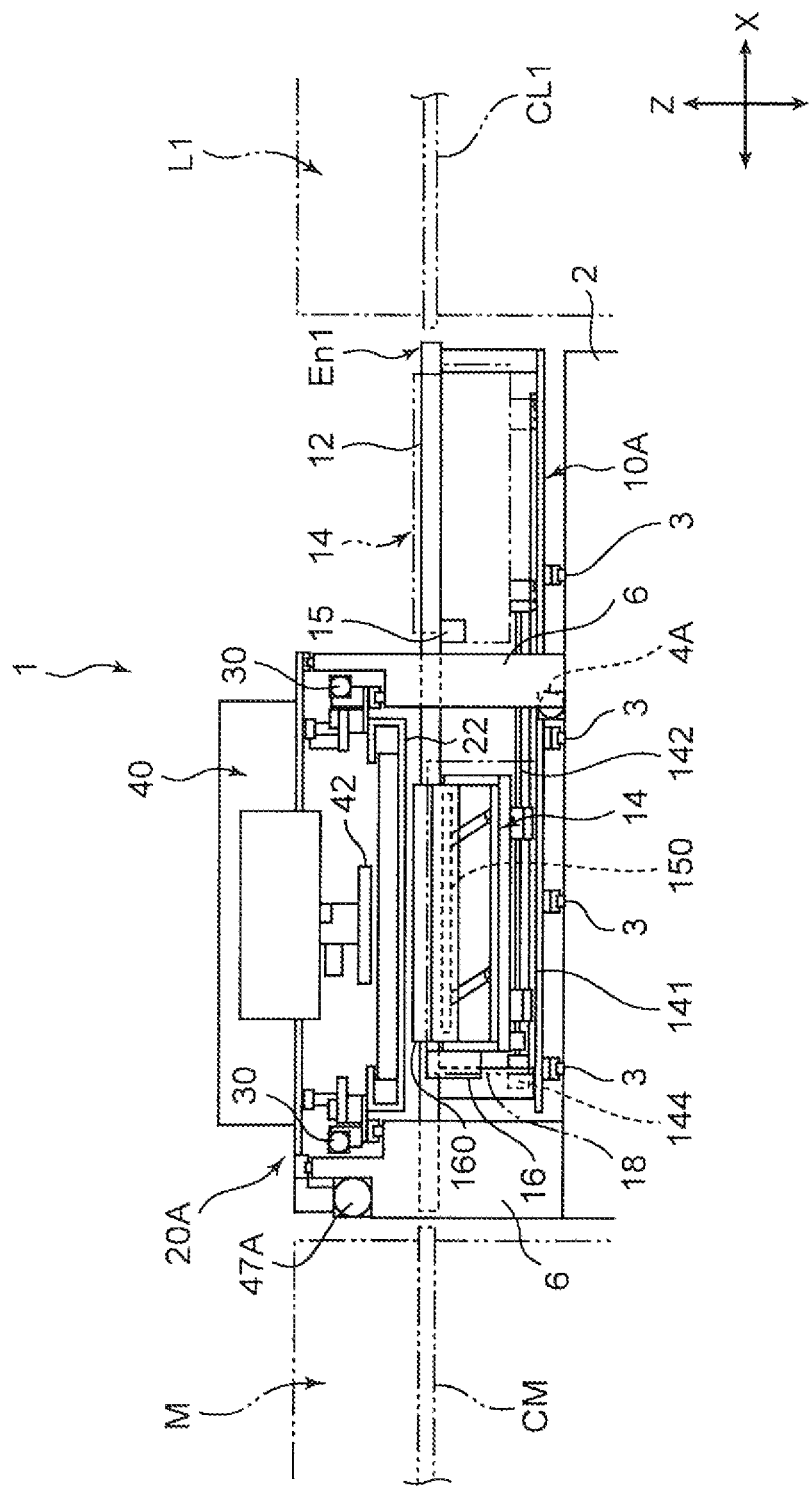
FIG. 2 is a front view showing the screen printing apparatus.

FIG. 1 and FIG. 2 show the first embodiment of the screen printing apparatus according to the present disclosure, wherein FIG. 1 is a plan view and FIG. 2 is a front view, each of which is schematically showing the screen printing apparatus.

This screen printing apparatus 1 is built into the manufacturing line of a printed circuit board (PCB) in a state of interlocking a dual transfer-type component mounting device M which is disposed at the downstream side of the screen printing apparatus 1. In the illustrated example, the screen printing apparatus 1 (hereinafter abbreviated as the "printing apparatus 1") is installed between two loaders L1, L2 (first loader L1 and second loader L2) disposed in parallel and one dual transfer-type component mounting device M. The printing apparatus 1 performs printing to substrates W that are sent out from the respective loaders L1, L2 on the upstream side, and then sends the substrates W to the component mounting device M on the downstream side.

In the ensuing explanation, the printing apparatus 1 is explained with the transfer direction of the substrate W in the manufacturing line as the X axis direction, the direction that is orthogonal to the X axis direction on the horizontal plane as the Y axis direction, and the direction (vertical direction) that is orthogonal to both the X axis direction and the Y axis direction as the Z axis direction.

The printing apparatus 1 comprises, on its foundation 2, two substrate support tables 10A, 10B for supporting the substrates W, and two print executing parts 20A, 20B for performing printing individually to the substrates W supported by the substrate support tables 10A, 10B in a state where the substrate support tables 10A, 10B have respectively stopped at predetermined positions in the Y axis direction.

The printing apparatus 1 includes two substrate loading parts En1, En2 (first substrate loading part En1 and second substrate loading part En2) at one side end in the X axis direction on the foundation 2 (upstream end in the substrate transfer direction). The printing apparatus 1 also includes two corresponding substrate unloading parts Ex1, Ex2 (first substrate unloading part Ex1 and second substrate unloading part Ex2) at the other side end (downstream end in the substrate transfer direction). The printing apparatus 1 loads the substrate W which has been sent out from the first loader L1 into the apparatus through the first substrate loading part En1, the printing apparatus 1 performs printing to the substrate W, and the printing apparatus 1 unloads the printed substrate W from the first substrate unloading part Ex1 to the component mounting device M. At the same time, the printing apparatus 1 also loads the substrate W which has been sent out from the second loader L2 into the apparatus through the second substrate loading part En2, the printing apparatus 1 performs printing to the substrate W, and the printing apparatus 1 unloads the printed substrate W from the second substrate unloading part Ex2 to the component mounting device M.

The respective substrate unloading parts Ex1, Ex2 are inwardly Y-axially offset with respect to the substrate loading parts En1, En2 so as to correspond with the two substrate transfer lines of the component mounting device M. In the drawings, reference numerals CL1, CL2, CM1, and CM2 are respectively designate belt conveyer pairs configuring substrate transfer lines each of which are mounted on the loaders L1, L2 and the component mounting device M. The substrate W is transferred along these belt conveyer pairs CL1, CL2, CM1, and CM2 (hereinafter abbreviated as the "conveyer pairs CL1, CL2, CM1, and CM2").

The substrate loading parts En1, En2 and the substrate unloading parts Ex1, Ex2 respectively indicate specific positions on the foundation 2. The positions of the substrate loading parts En1, En2 and the substrate unloading parts Ex1, Ex2 are set by a control device 8 described later according to the respective loaders L1, L2 disposed on the upstream side and the component mounting device M disposed on the downstream side. In this embodiment, the positions of the substrate loading parts En1, En2 are the substrate loading positions of the present disclosure, and the positions of the substrate unloading parts Ex1, Ex2 are the substrate unloading positions of the present disclosure (the same as in the respective embodiments described later).

The substrate support tables 10A, 10B (also called first substrate support table 10A and second substrate support table 10B which respectively correspond to the movable table of the present disclosure) receive the substrates W loaded from the loaders L1, L2 in the substrate loading parts En1, En2. The substrate support tables 10A, 10B support the substrates W to be printable. The substrate support tables 10A, 10B send the printed substrates W to the component mounting device M in the substrate unloading parts Ex1, Ex2. Among the above tables, the first substrate support table 10A receives the substrate W loaded from the loader L1 in the first substrate loading part En1 and supports the substrate W so that the first printing executing part 20A enables printing on the substrate W. The second substrate support table 10B receives the substrate W loaded from the loader L2 in the second substrate loading part En2 and supports the substrate W so that the second printing executing part 20B enables printing on the substrate W.

Figure 3:
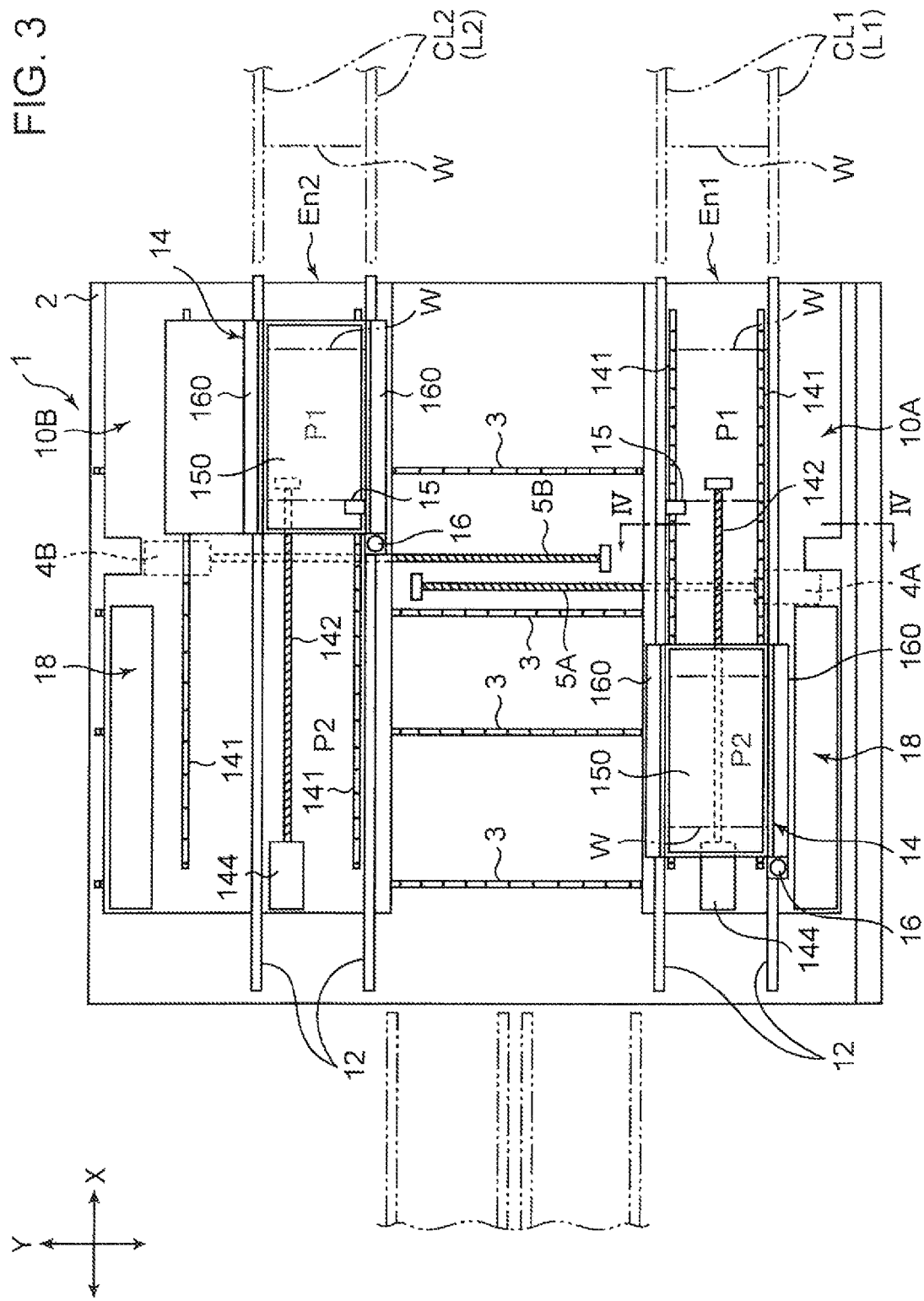
FIG. 3 is a plan view showing the substrate support table and its drive mechanism and the like to be built into the screen printing apparatus (plan view showing a state in which the print executing part and the like are omitted from the screen printing apparatus).

The respective substrate support tables 10A, 10B have a substantial rectangular shape in a plan view that is elongated in the X axis direction as shown in FIG. 3, and are configured to move individually in the Y axis direction based on a table drive mechanism. The table drive mechanism is in the form of a screw feeding mechanism. That is, the respective substrate support tables 10A, 10B are supported movably on a common fixed rail 3 provided on the foundation 2 and extending in the Y axis direction. The substrate support tables 10A, 10B are thus respectively configured so as to be driven by motors 4A, 4B via screw axes 5A, 5B. In addition, the first substrate support table 10A is configured to move between a receiving position (position shown in FIG. 1 and FIG. 3) where the substrate W loaded from the loader L1 in the first substrate loading part En1 can be received, and a sending position where the substrate W can be sent to the component mounting device M in the first substrate unloading part Ex1, based on the motor control of the control device 8 described later. Similarly, the second substrate support table 10B is configured to move between a receiving position (position shown in FIG. 1 and FIG. 3) where the substrate W loaded from the loader L2 in the second substrate loading part En2 can be received and a sending position where the substrate W can be sent to the component mounting device M in the second substrate unloading part Ex2, based on the motor control of the control device 8 described later.

Each of the substrate support tables 10A, 10B comprises a conveyer pair 12 extending in the X axis direction, a conveyer width variable mechanism, a clamp unit 14 for holding the substrate W on the conveyer pair 12 in such a way that the print executing parts 20A, 20B can perform printing on the substrate W, a clamp unit drive mechanism for moving the clamp unit 14 in the X axis direction along the conveyer pair 12, and a cleaning unit 18 for cleaning a screen mask 21 described later. In this embodiment, the clamp unit 14 (substrate holding means) and the clamp unit drive mechanism (moving means) correspond to the transferring and holding means in the present disclosure, and the conveyer pair 12 and the conveyer width variable mechanism correspond to the transferring means in the present disclosure.

The conveyer pair 12 comprises belt conveyers. The conveyer pair 12 has a loading side end by which the conveyer pair 12 receives the substrate W loaded from the loaders L1, L2 in the substrate loading parts En1, En2 so that the conveyer pair 12 transfers the substrate W to a substrate standby position P1 described later. Also the conveyer pair 12 transfers the printed substrate W from a print executing position P2 described later to an unloading side end placed in the substrate unloading parts Ex1, Ex2.

The conveyer pair 12 delivers the substrate W with respect the X axis direction (FIG. 5A), in accordance with moves of belts 121 rotated by the drive of a motor 120 (shown in FIG. 10), in a state that each of the belts 121 holds a respective end portion of the substrate W. The conveyer width variable mechanism is configured to change the interval (that is, the conveyer width) of the two conveyers which configures the conveyer pair 12, according to the size of the substrate W. The conveyer width variable mechanism comprises, for example, a screw feeding mechanism. One conveyer of the aforementioned two conveyers refers to a fixed conveyer that is fixed on the substrate support tables 10A, 10B via a prop, and the other conveyer refers to a movable conveyer which is movably supported by a fixed rail on the substrate support tables 10A, 10B so that the movable conveyer enables back and forward movement from the one conveyer (move in the Y axis direction). Then, the interval of the two conveyers is changed by driving the other conveyer via a screw axis driven by a motor 123 (shown in FIG. 10) along the fixed rail. That is, the conveyer pair 12 is defined as a variable stroke-type conveyer capable of changing the interval according to the size of the substrate W.

In this embodiment, the conveyer width variable mechanism with respect to the first substrate support table 10A positioned on the device's front side (lower side of FIG. 1 and FIG. 3) is configured such that the rear side one of the conveyer pair 12 is defined as a fixed conveyer and the front side one is defined as a movable conveyer so that the interval of the conveyers is changed with the back-side conveyer as a reference. On the contrary, the conveyer width variable mechanism with respect to the rear substrate support table 10B is configured such that the front side one of the conveyer pair 12 is defined as a fixed conveyer and the rear side one is defined as a movable conveyer so that the interval of the conveyers is changed with the front-side conveyer as a reference. In view of the printing apparatus 1 as a whole, both substrate support tables 10A, 10B define the inner side as a reference for changing the interval of the conveyers by the respective conveyer pairs 12.

The clamp unit 14 includes a base member 140 (shown in FIG. 4) which is supported movably in the X axis direction along the fixed rail 141 provided on the substrate support tables 10A, 10B. On the base member 140, the clamp unit 14 comprises a backup mechanism for raising and supporting the substrate W from the conveyer pair 12, and a clamp mechanism for fixing the substrate W that was raised by the backup mechanism.

Figure 4:
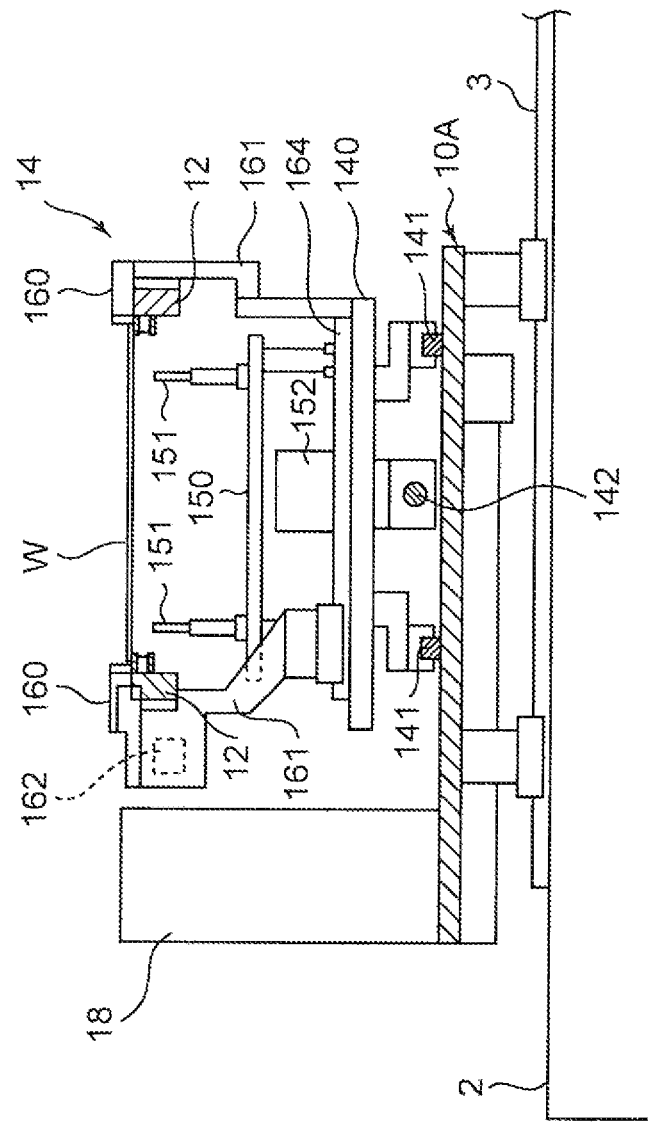
FIG. 4 is a cross section of the screen printing apparatus showing the configuration of the substrate support table IV-IV of FIG. 3.
Figure 5A:
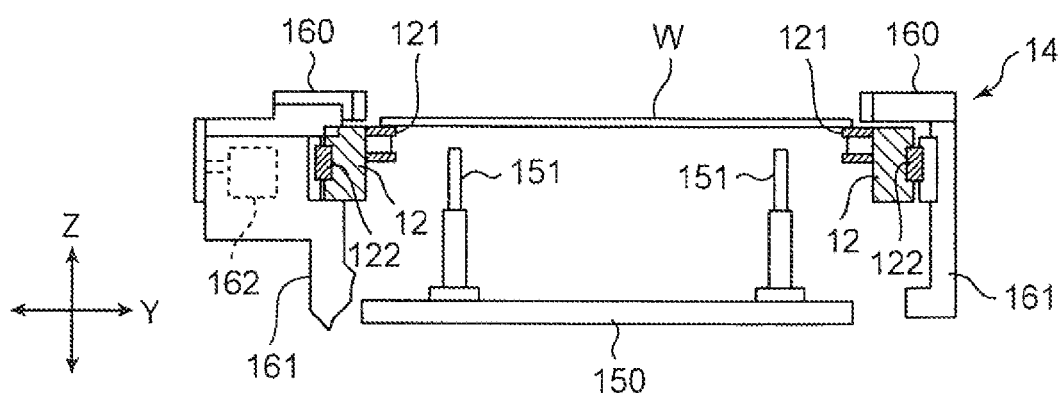
FIGS. 5A and 5B are enlarged views of the relevant parts of the clamp unit in FIG. 4, with FIG. 5A showing the unclamped state of the substrate, and FIG. 5B showing the clamped state of the substrate.
Figure 5B:
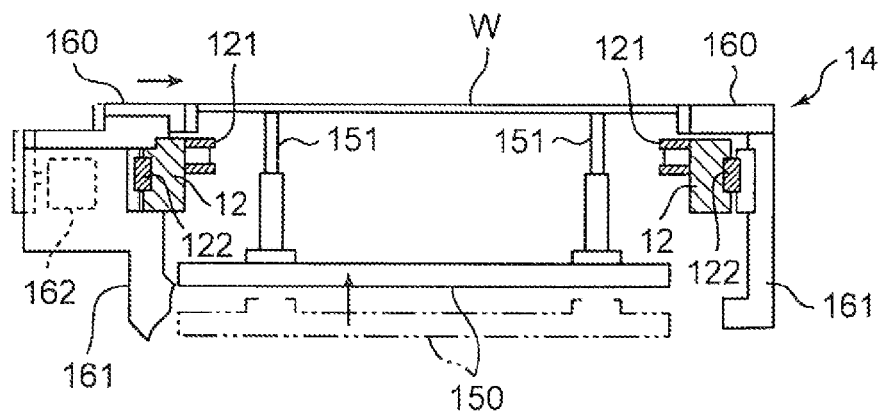

As shown in FIG. 4 and FIG. 5A, the backup mechanism includes a plurality of backup pins 151 (hereinafter abbreviated as the "pins 151") of a predetermined arrangement, a backup table 150 (BU table 150) which is elevatably supported on the base member 140 via a link mechanism or the like, and a drive motor 152 or the like. The backup mechanism is configured so that the BU table 150 is displaced between a predetermined withdrawal position and an operating position raised therefrom in response to the drive of the motor 152. The withdrawal position is a position (position shown in FIG. 5A) in which the tip position of the pins 151 is placed lower than the lower face of the substrate W supported by the conveyer pair 12 (belt 121). The operating position is a position in which the tip position of the pins 151 is placed higher than the lower face of the substrate W. Accordingly, the backup mechanism raises the substrate W from the conveyer pair 12 when the BU table 150 is disposed at the operating position as shown in FIG. 5B.

The clamp mechanism includes a pair of clamp members 160 disposed at a position above the conveyer 12 and extending parallel to each other in the X axis direction, an arm member 161 to which the clamp members 160 are mounted, and an actuator for driving the clamp members, say, by a bi-directional air cylinder 162. One side of the two clamp members 160 (left side in FIG. 4 and FIG. 5A) is mounted on the arm member 161 so that it can be displaced in the Y axis direction. The one side of the two clamp members 160 displaces between the withdrawal position indicated in the drawing and the forward position by the drive of the air cylinder 162, as shown in FIG. 5B. The clamp mechanism clamps the substrate W as shown in FIG. 5B by displacing the one side clamp member 160 from the withdrawal position to the forward position so as to sandwich the substrate W which has been raised by the backup mechanism with the other side of the clamp member 160 in the Y-direction.

With the printing apparatus 1, printing is performed upon placing the screen mask 21 described later atop the substrate W, which is raised from the conveyer pair 12 by the clamp unit 14 and clamped by the clamp member 160. Thus, the clamp unit 14 functions to hold the substrate lifting above the conveyer pair 12 in a state that the print executing parts 20A, 20B enable printing on it.

Each of the arm members 161 of the clamp mechanism is formed so as to cover the conveyer pair 12 from the outside (outside in the Y axis direction). Each of the arm members 161 is slidably coupled to a fixed rail 122 mounted on the respective conveyer pairs 12 in the X axis direction. The configuration in which the respective arm members 161 is coupled and guided to the conveyer pair 12 (fixed rail 122) enables maintaining the relative positions between the conveyer pair 12 and the respective clamp members 160 in the Y axis direction to be constant, yet allowing the clamp unit 14 to be moved in the X axis direction by the clamp unit drive mechanism.

Moreover, one side of the respective arm members 161, specifically, the arm member 161 (right-side arm member in FIG. 4) on the side, which is coupled to the fixed conveyer of the conveyer pair 12, is fixed to the base member 140. The other side of arm member 161 (left-side arm member in FIG. 4), which is coupled to the movable conveyer, is supported displaceably in the Y axis direction along the fixed rail 164 provided on the base member 140. Accordingly, when the interval of the conveyer pair 12 is changed, one side arm member 161 moves in the Y axis direction integrally with the movable conveyer, and the interval of both clamp members 160 is thereby automatically adjusted. That is, the interval of both clamp members 160 will automatically be changed to an interval so that the clamp members 160 enable clamping of the substrate W that is transferred after an interval of the conveyer pair 12 has been changed. Each of the clamp members 160 is configured so that the clamp member mounted on the movable conveyer side is driven. With this configuration, the substrate W is clamped with the fixed conveyer side as a reference. Accordingly, the substrate W is clamped with the device's back side as a reference with respect to the clamp unit 14 of the first substrate support table 10A. The substrate W is clamped with the device's front side as a reference with respect to the clamp unit 14 of the second substrate support table 10B.

The clamp unit drive mechanism comprises a screw feeding mechanism. That is, the base member 140 of the clamp unit 14 is configured to be movably supported on the fixed rail 141 provided on the foundation 2 and extending in the X axis direction, and the base member 140 is configured to be driven by the motor 144 via a screw axis 142.

On the respective substrate support tables 10A, 10B, a standby space is provided on the side of the substrate loading parts En1, En2, as shown in FIG. 3. A position of the space is defined as a substrate standby position P1 (which corresponds to the specific position of the present disclosure). A predetermined position that is downstream of the substrate standby position P1 is defined as a print executing position P2. Based on the motor control of the control device 8 described later, the clamp unit 14 moves between the substrate standby position P1 and the print executing position P2 along the conveyer pair 12 and the fixed rail 141. In association with the movement of the clamp unit 14, the drive of the BU table 150 and the clamp member 160 is controlled by the control device 8. That is, after the clamp unit 14 moves to the substrate standby position P1, the substrate W is raised from the conveyer pair 12 and clamped by the clamp member 160. The substrate W will be transferred to the print executing position P2 following the movement of the clamp unit 14 in a state where the print executing parts 20A, 20B enable printing the substrate W. After completing the printing, the holding state of the substrate W will be released at the print executing position P2 and the substrate W will be delivered from the clamp unit 14 onto the conveyer pair 12. In the ensuing explanation, for the sake of convenience, the state in which the substrate W is held by the clamp unit 14 as described above (state in which the substrate W is raised from the conveyer pair 12 and clamped by the clamp member 160) is simply referred to as the "clamped state", and the state in which the holding is released is referred to as the "unclamped state".

Although only the clamp unit 14 of the first substrate support table 10A is shown in FIG. 2, FIG. 4 and FIG. 5, the configuration of the second substrate support table 10B is basically common with the first substrate support table 10A except the substrate W is clamped with the device's front side as a reference.

Although a detailed view of the cleaning unit 18 is omitted, the cleaning unit 18 comprises a cleaning head which includes a pad that is slidable on the lower face of the screen mask 21 described later, and a suction nozzle for sucking the screen mask 21 based on negative pressure via the pad. While the substrate support tables 10A, 10B move in the Y axis direction, the cleaning unit 18 slides the cleaning head across the lower face of the screen mask 21 to remove the paste remaining on the lower face of the mask and in the pattern holes.

The cleaning head is configured to be elevatable relative to the substrate support tables 10A, 10B, and is disposed at the operating position that is slidable on the screen mask 21 only during the cleaning process, and otherwise disposed at the withdrawal position lowered from the operating position.

In FIG. 1 to FIG. 3, reference numeral 15 designates a stopper mechanism of the conveyer pair 12. The stopper mechanism is used for causing the substrate W, which is received on the conveyer pair 12 from the substrate loading parts En1, En2 and then transferred, to stop at the substrate standby position P1, and standby at that position. The stopper mechanism 15 includes a stopper axis that is driven forward or backward by an actuator such as an air cylinder. The stopper mechanism 15 is configured to be switchable between an activated state and a stopped state. In the activated state the stopper axis is moved into the transfer path of the substrate W in the conveyer pair 12 to restrict the movement of the substrate W. In the stopped state the stopper axis is withdrawn to outside the transfer path to allow the movement of the substrate W. With the foregoing configuration, the substrate W loaded at the substrate standby position P1 is halted at the substrate standby position P1 until the substrate W is raised from the conveyer pair 12.

Reference numerals 16 in the drawings are a mask recognition camera mounted on the clamp unit 14. The mask recognition camera 16 is a camera comprising a CCD area sensor or the like, which is used for imaging, from the lower side, signs such as marks or symbols indicated on the lower face of the screen mask for recognizing the relative positions of the screen mask 21 described later and the substrate W.

Print executing parts 20A, 20B (first print executing part 20A and second print executing part 20B) are provided above the substrate support tables 10A, 10B. Specifically, the print executing parts 20A, 20B are placed at the upper position of the print executing positions P2 defined by the substrate support tables 10A, 10B respectively disposed at the receiving positions.

Figure 6:
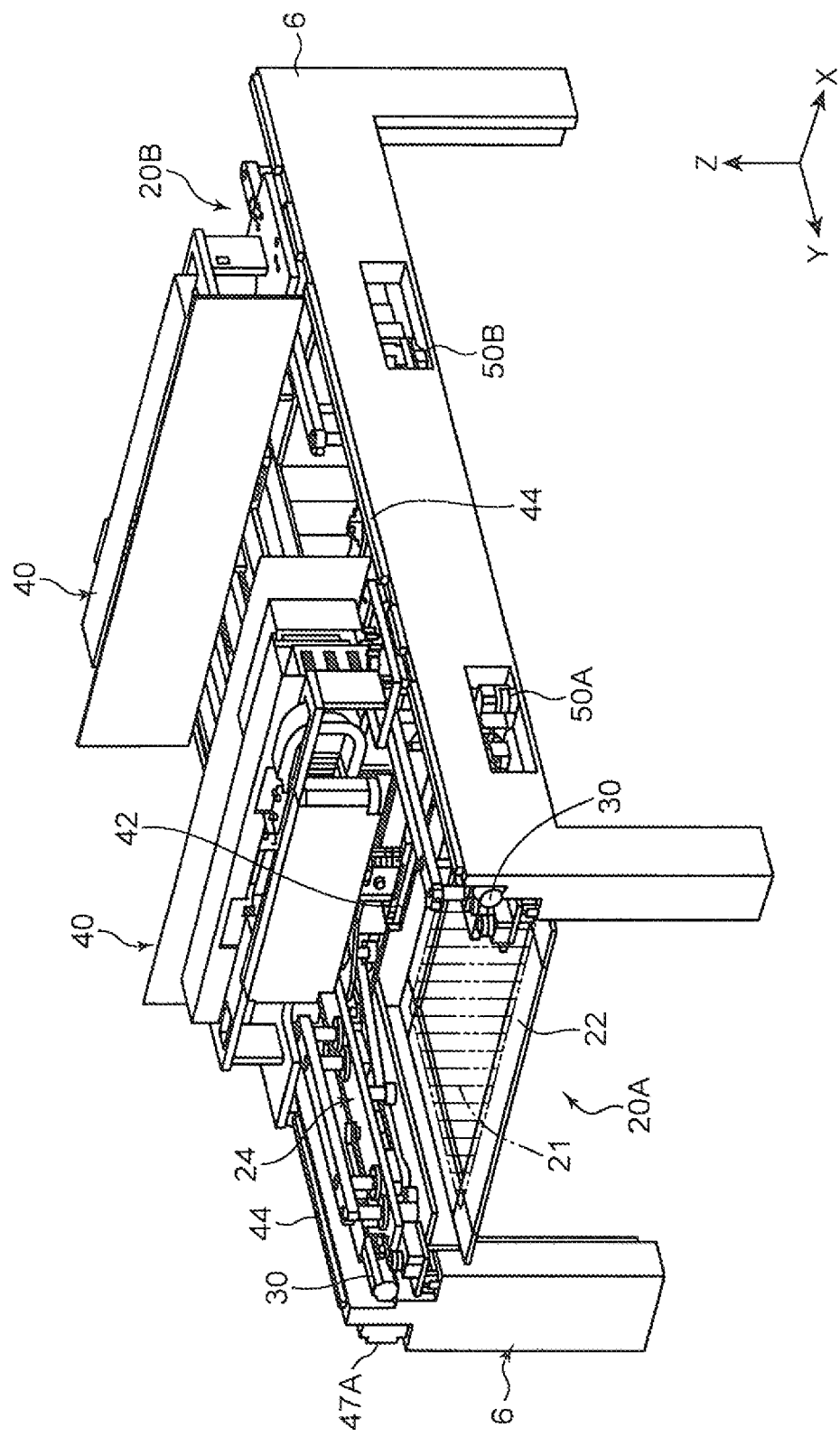
FIG. 6 is a perspective view showing the print executing part and the like to be built into the screen printing apparatus.

FIG. 6 is a perspective view showing a state where only the print executing parts 20A, 20B are extracted from the printing apparatus 1. The respective print executing parts 20A, 20B are juxtaposed in the Y axis direction. Each of the print executing parts 20A, 20B includes a mask holding mechanism for holding the mask 21, a squeegee unit 40 disposed along the X axis direction, a squeegee drive mechanism disposed along the Y axis direction and moving the squeegee unit 40 in the Y axis direction, and the like. The respective mechanisms configuring the print executing parts 20A, 20B are disposed in a pair of apparatus frames 6 which are formed in a gate shape and installed on the foundation 2 with a predetermined interval with respect to the X axis direction. The pair of apparatus frames 6 are adapted to straddle the substrate W that moves from the substrate standby position P1 to the print executing position P2 on the first substrate support table 10A, the substrate W that moves from the substrate standby position P1 to the print executing position P2 on the second substrate support table 10B, and the substrate that moves from the print executing position P2 to the substrate unloading part Ex on the substrate support tables 10A, 10B positioned at the sending positions.

Figure 7:
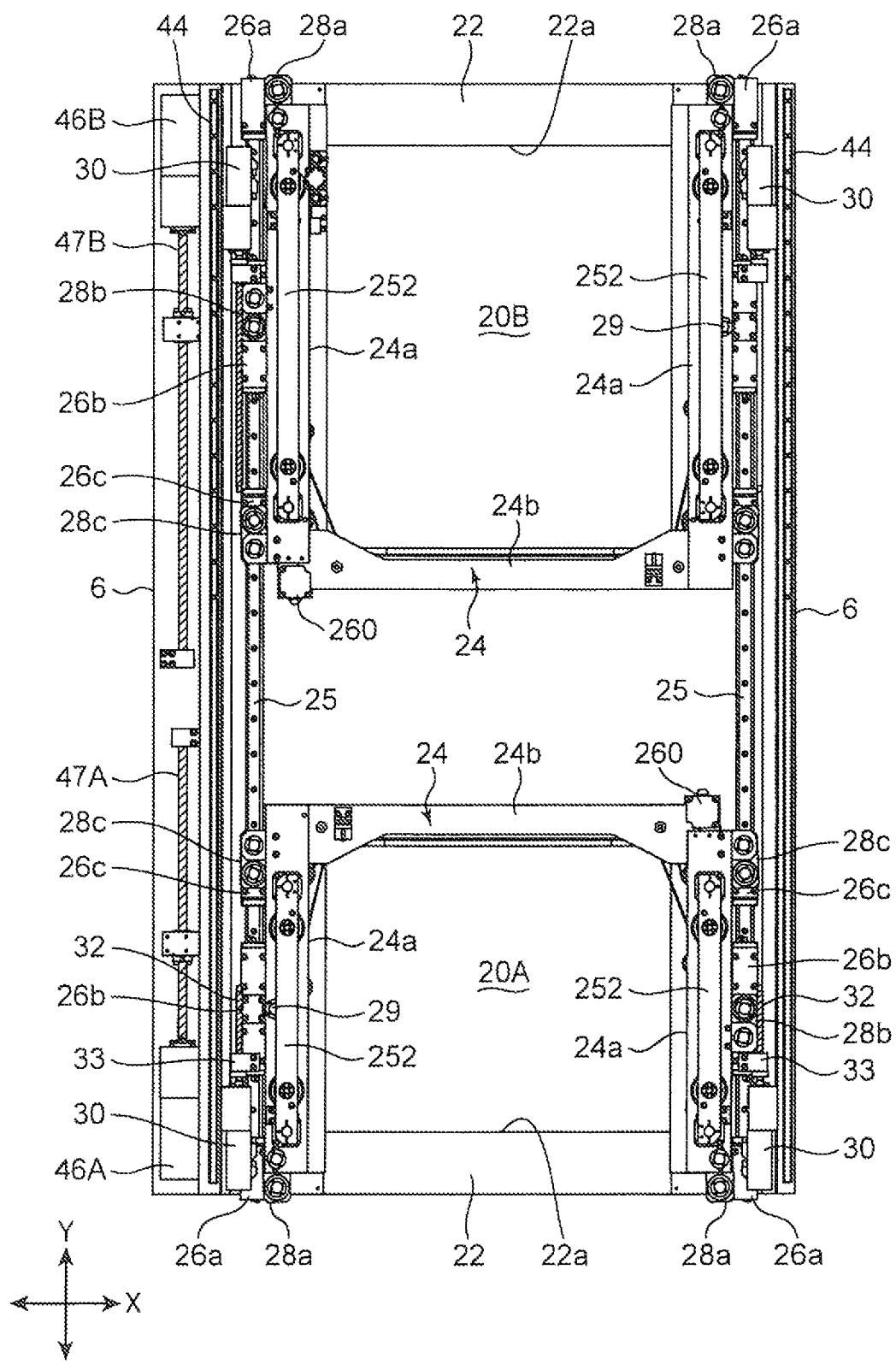
FIG. 7 is a plan view showing the print executing part.
Figure 8:
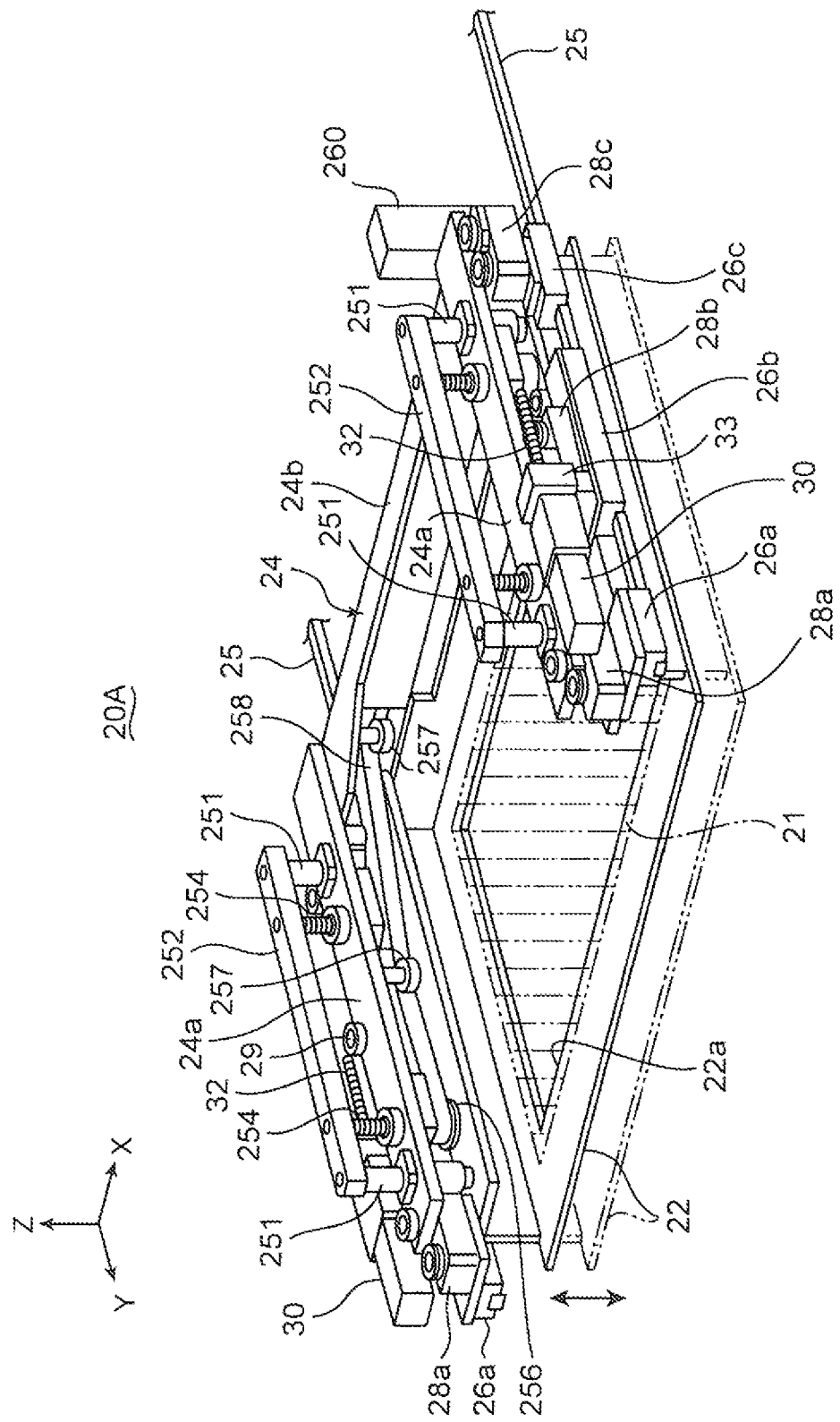
FIG. 8 is a perspective view showing the mask holding mechanism for holding the screen mask.

As shown in FIG. 6 to FIG. 8, each mask holding mechanism includes a rectangular mask fixing member 22 to which the screen mask 21 (hereinafter abbreviated as the "mask 21") is detachably assembled, an elevating drive mechanism for elevating the mask fixing member 22, a rotating drive mechanism for rotating the fixing member 22 around the Z axis together with the elevating drive mechanism, and a Y axis drive mechanism for moving the fixing member 22 in the Y axis direction together with the elevating drive mechanism.

As shown in FIG. 7 and FIG. 8, the mask fixing member 22 has a rectangular shape. An opening 22a for printing is formed in the center of the mask fixing member 22. The mask 21 stretched over a frame is fasten to the mask fixing member 22 so as to cover the opening 22a together with the frame.

[Each driving mechanism of the mask fixing member 22 has the following configuration.

Each apparatus frame 6 is provided with a fixed rail 25 extending in the Y axis direction. The mask support member 24 for elevatably supporting the mask fixing member 22 is movably supported by the fixed rail 25. Specifically, the mask support member 24 which has a channel like shape in a planar view comprises a pair of Y axis plate parts 24a extending along the fixed rail 25, and an X axis plate part 24b which connects the ends of the plate parts 24a. The respective Y axis plate parts 24a are coupled to the sliders 26a to 26c mounted on each of the fixed rails 25, causing the mask support member 24 to move along the Y axis direction.

As shown in FIG. 8, a pair of guide axes 251 extending in the Z axis direction intersects the respective Y axis plate parts 24a of the mask support member 24. The mask fixing member 22 is fixed to the bottom end of the guide axes 251. A connecting member 252 is fixed to the upper end of the guide axes 251. A pair of pulley-type nuts 256 is assembled at a position between the guide axes 251 in such a way that the nuts 256 are rotatable but fixed in the Z axis direction on the respective Y axis plate parts 24a of the mask support member 24. A screw axis 254 is screwed and inserted into the respective pulley-type nuts 256 in the Z axis direction. One end of the screw axis 254 is fixedly supported by the mask fixing member 22 and other end is supported by the connecting member 252. A motor 260 is fixed to the mask support member 24. A drive pulley not shown is mounted on an output axis of the motor 260. A drive belt 258 is placed across the drive pulley, a plurality of idle pulleys 257 mounted on the mask support member 24, and the pulley-type nuts 256.

According to the aforementioned configuration, when the motor 260 is driven, the torque is transmitted to the pulley-type nuts 256 via the drive belt 258. The pulley-type nuts 256 are thereby rotated, and the screw axis 254 moves in the axis direction thereof according to the rotation. Consequently, as shown with the arrow in FIG. 8, the mask fixing member 22 fixed by the screw axis 254 moves in the up-down direction (Z axis direction) while being guided by the guide axes 251. The mask 21 is configured to be displaced between an overlapping height position and a withdrawal position during the printing, based on the control of the motor 260 of the control device 8 described later. In the overlapping height position (position indicated with a two-dot chain line in FIG. 8) the mask 21 is placed atop of the substrate W supported by the substrate support tables 10A, 10B, specifically, the substrate W clamped by the clamp unit 14 in a state of being raised from the conveyer pair 12. The withdrawal position (position indicated with a solid line in the drawing) is set higher than the foregoing height position.

Figure 9:
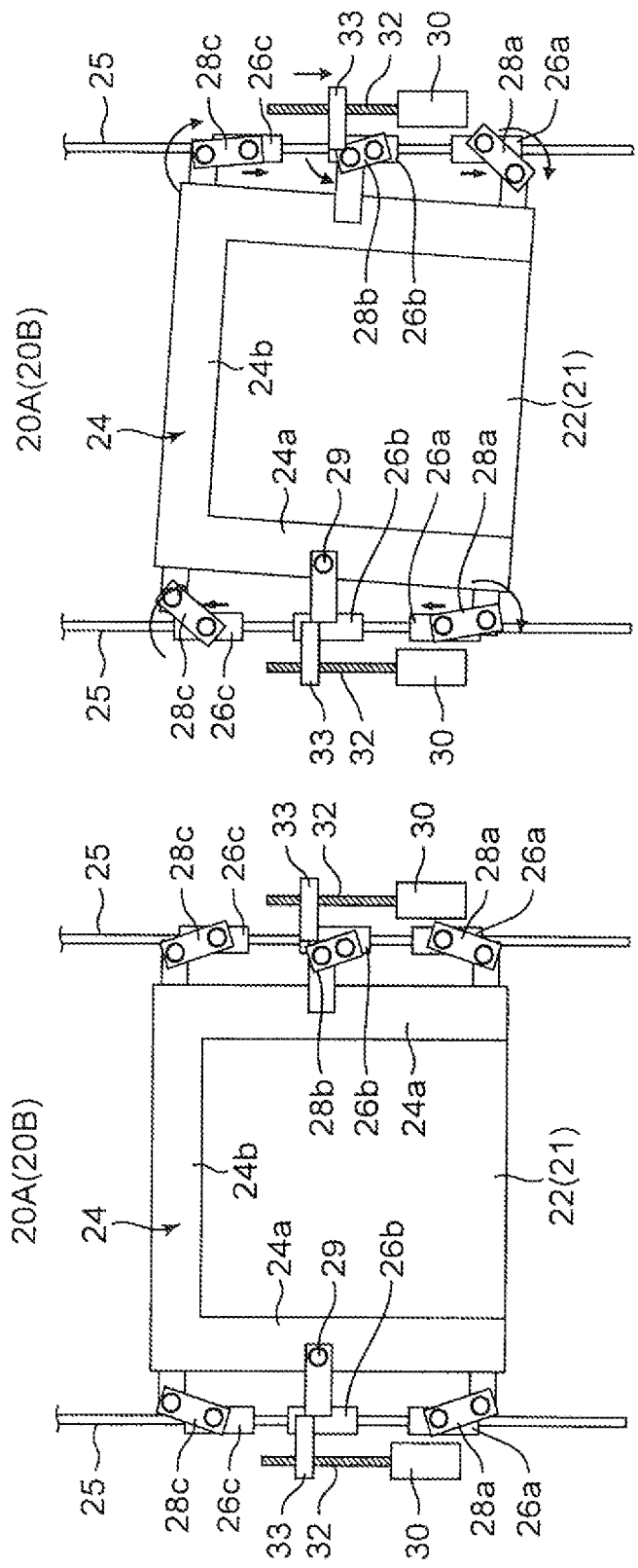
FIGS. 9A and 9B are schematic plan views of the mask holding mechanism explaining the rotating drive mechanism and the Y axis drive mechanism to be built into the mask holding mechanism, with FIG. 9A showing a state before the mask rotation, and FIG. 9B showing a state after the mask rotation, respectively.

The mask support member 24 is coupled to the sliders 26a to 26c mounted on the respective fixed rails 25 as described above. Specifically, each Y axis plate part 24a is coupled to the sliders 26a to 26c via the link members 28a to 28c such that the mask support member 24 enables displacement around the Z axis with a specific point as a pivot. FIG. 9A is a view schematically showing the mask support member 24 and the like for facilitating the understanding of the foregoing structure. As shown in this drawing, the mask support member 24 is supported such that the middle position of the Y axis plate part 24a on one side (left side in the drawing) is coupled to the slider 26b via the pin 29, and both end positions in the Y axis direction in the Y axis plate part 24a on this one side are respectively coupled with the sliders 26a, 26c via the link members 28a, 28c both ends of which are the pin coupling. Three locations of both ends in the Y axis direction and middle portion of the Y axis plate part 24a on the other side of the mask support member 24 are similarly coupled with the sliders 26a to 26c via the link members 28a to 28c both ends of which are the pin coupling.

In addition, a nut member 33 is fixed to the slider 26b in the middle among the three sliders 26a to 26c which are respectively coupled to the respective Y axis plate parts 24a of the mask support member 24. The screw axis 32 extending in the Y axis direction is thread inserted into the nut member 33. The screw axis 32 is integrated with the output axis of a motor 30 fixed to the apparatus frame 6.

According to the foregoing configuration, when the respective motors 30 are driven at an equal speed in the same direction, the mask support member 24 moves in the Y axis direction while maintaining its state. Meanwhile, when only one of the motors 30 is driven, for instance, as shown in FIG. 9B, the mask support member 24 rotates around the Z axis with the pin 29 as the pivot.

In each of the print executing parts 20A, 20B, the squeegee unit 40 is disposed above the mask holding mechanism. The squeegee unit 40 spreads paste such as solder cream or conductive paste on the mask 21 via rolling (kneading). The squeegee unit 40 includes a single squeegee 42, a squeegee angle variable mechanism, not shown, for changing the inclination direction and the inclination angle of the squeegee 42 with respect to the mask 21, a squeegee elevating mechanism, not shown, for elevating the squeegee 42 between a printing work height position where the squeegee 42 slidably contacts the mask 21, and a withdrawal position (position indicated in FIG. 2 and FIG. 6) where the squeegee 42 is higher than the foregoing position, and the other elements.

The squeegee drive mechanism that drives the squeegee unit 40 in the Y axis direction comprises a screw feeding mechanism. That is, as shown in FIG. 6 and FIG. 7, the squeegee unit 40 of the respective print executing parts 20A, 20B is movably supported on the common fixed rail 44 provided on the apparatus frame 6 and extending in the Y axis direction. Each of the squeegee units 40 is configured to be independently driven by motors 46A, 46B via screw axes 47A, 47B, respectively.

In FIG. 6, reference numerals 50A, 50B designate substrate recognition cameras (correspond to the substrate imaging means of the present disclosure) that are used for imaging, from the upper side, signs such as a plurality of marks and symbols of the substrate W for recognizing the relative positions of the substrate W supported by each of the substrate support tables 10A, 10B and the print executing parts 20A, 20B. The substrate recognition cameras 50A, 50B (first substrate recognition camera 50A and second substrate recognition camera 50B) are cameras comprising a CCD area sensor or the like as well as the mask recognition camera 16. The substrate recognition cameras 50A, 50B are fixed to the apparatus frames 6. Specifically, of the apparatus frames 6 positioned on the side of the substrate loading parts En1, En2 (loading side end of the conveyer pair 12), the first substrate recognition camera 50A is fixed to the side position of the first print executing part 20A, and the second substrate recognition camera 50B is fixed to the side position of the second print executing part 20B, respectively. With this configuration the first substrate recognition camera 50A enables imaging a plurality of signs of the substrate W which moves in both directions of the X axis direction and the Y axis direction relative to the first substrate recognition camera 50A, wherein the substrate W is held by the clamp unit 14 that moves from the substrate standby position P1 to the print executing position P2 in the X axis direction on the first substrate support table 10A that moves in the Y axis direction as it returns from the sending position to the receiving position. The second substrate recognition camera 50B enables imaging a plurality of signs of the substrate W which moves in both directions of the X axis direction and the Y axis direction relative to the second substrate recognition camera 50B, wherein the substrate W is held by the clamp unit 14 that moves from the substrate standby position P1 to the print executing position P2 in the X axis direction on the second substrate support table 10B that moves in the Y axis direction from the sending position to the receiving position.

Figure 10:
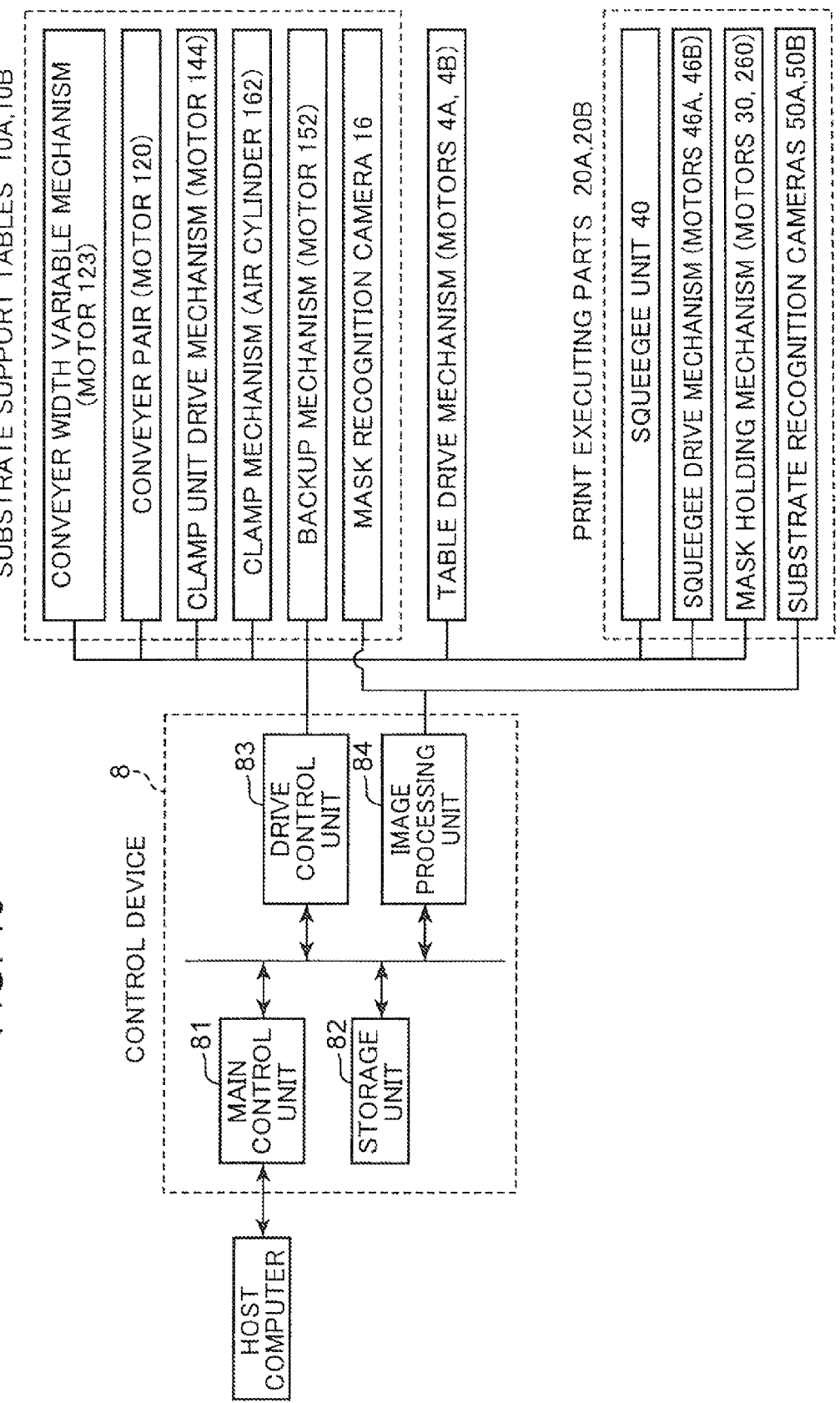
FIG. 10 is a block diagram showing the electrical configuration of the screen printing apparatus.

The printing apparatus 1 comprises a control device 8 (corresponding to the control means of the present disclosure) having a CPU and the like as its constituent elements. The control device 8, as shown in FIG. 10, comprises a main control unit 81 for governing the control of operations of the overall printing apparatus 1, a storage unit 82 for storing various processing programs and various data, a drive control unit 83 for controlling the drive of the substrate support tables 10A, 10B and the print executing parts 20A, 20B, and an image processing unit 84 for performing predetermined image processing of the image data from each of the recognition cameras 16, 50A, 50B. The main control unit 81 and the like are mutually connected via a bus to enable the exchange of signals. According to the print execution programs or the like given by an external host computer, the main control unit 81 governs the control of the series of printing operations, or printing operations in a series of the interval adjustments of the conveyer pair 12 of each of the substrate support tables 10A, 10B corresponding to the substrate W to be printed, the reception of the substrate W loaded from the loaders L1, L2 in the substrate loading parts En1, En2, the print processing to be performed by the print executing parts 20A, 20B, and the unloading of the substrate W to the component mounting device M in the substrate unloading parts Ex1, Ex2, to be performed by the substrate support tables 10A, 10B and the print executing parts 20A, 20B.

The print execution programs given from the host computer to the printing apparatus 1 contain data related to the positions of the conveyer pairs CL1, CL2 of the respective loaders L1, L2, and the positions of the conveyer pairs CM1, CM2 of the component mounting device M during the coupling to the printing apparatus 1, and data related to the size (dimension) of the substrate W to be printed. The main control unit 81 performs the initialization including the setting of the positions of the substrate loading parts En1, En2 and the substrate unloading parts Ex1, Ex2 based on the foregoing print execution programs. The main control unit 81 controls the series of printing operations based on the positions of substrate loading parts En1, En2 and the substrate unloading parts Ex1, Ex2 set forth in the foregoing initialization.

The host computer governs the control of the manufacturing line of a printed circuit board to which the printing apparatus 1 is built therein. Including the printing apparatus 1, all devices (loaders L1, L2 and component mounting device M) built into the manufacturing line establish an online connection such that all these devices enable interconnection with the host computer. The print execution program and various data are given to the respective devices of the printing apparatus 1 from the host computer.

The printing operation of the printing apparatus 1 based on the control of the control device 8 is now explained with reference to FIG. 11 and FIG. 12.

Figure 11A:
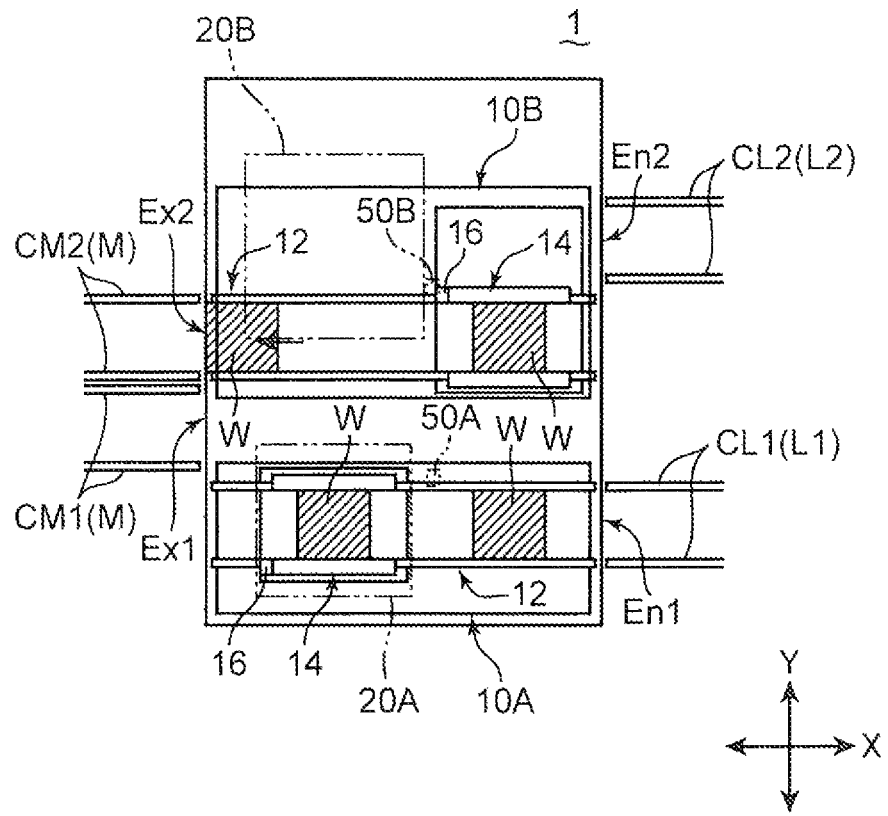
FIGS. 11A and 11B are schematic plan views explaining the printing operation of the screen printing apparatus based on the control of the control device, and showing the printing operation in a time series.

FIG. 11A schematically shows the state of a particular point in time of the printing operation that is continuously performed in the printing apparatus 1, and the state of the substrate support tables 10A, 10B and the print executing parts 20A, 20B at the point in time is as follows.

The first substrate support table 10A is disposed at the receiving position on the side of the first substrate loading part En1. The first substrate support table 10A is in a state where the preceding substrate W is disposed at the print executing position P2 in a state of being held by the clamp unit 14, and the subsequent substrate is loaded at substrate standby position P1 and in a standby state, and the preceding substrate W is subjected to printing by the print executing part 20A. The substrate W at the print executing position P2, as shown in FIG. 5B, is supported by the clamp unit 14 in a state of being raised from the conveyer pair 12.

Meanwhile, the second substrate support table 10B is disposed at the sending position on the side of the second substrate unloading part Ex2. The second substrate support table 10B is in a state where the printed preceding substrate W is being sent out from the print executing position P2 to the unloading side end by the conveyer pair 12 and about to be sent out to the component mounting device M at the second substrate unloading part Ex2, and the subsequent substrate W at the substrate standby position P1 is in a state of being clamped by the clamp unit 14.

Figure 11B:
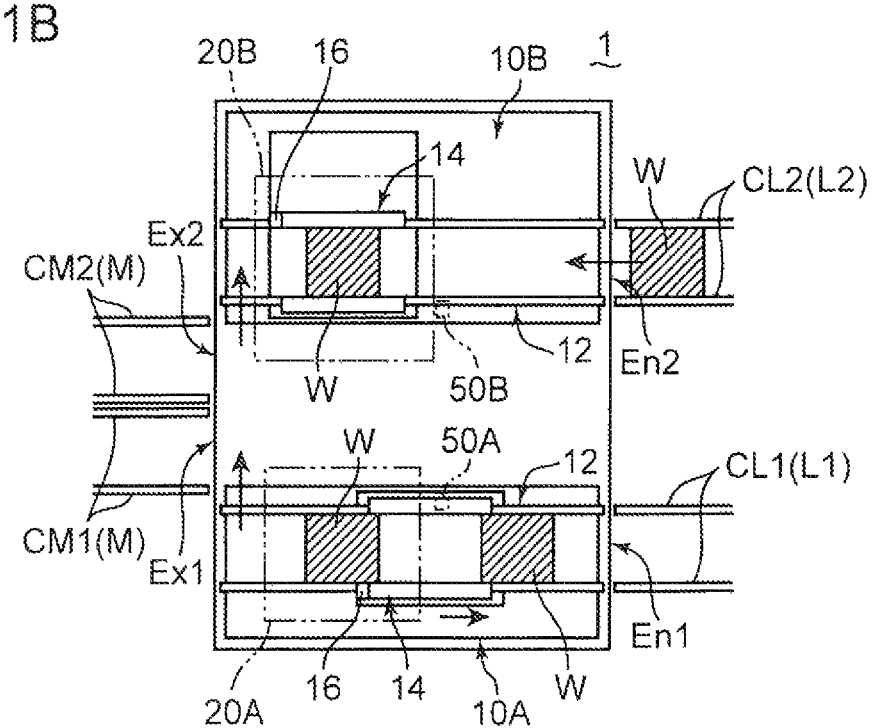

In the state shown in FIG. 11A, when the printing of the preceding substrate W on the first substrate support table 10A is complete, the first substrate support table 10A starts moving from the receiving position toward the sending position, and at the same time, the clamped state of the substrate W by the clamp unit 14 is released so that the printed preceding substrate W is delivered onto the conveyer pair 12. Then the clamp unit 14 moves from the print executing position P2 to the substrate standby position P1, and the subsequent substrate W in standby at the substrate standby position P1 is clamped by the clamp unit 14 (FIG. 11B). Specifically, after the clamp unit 14 arrives to the substrate standby position P1, the substrate W is raised from the conveyer pair 12 (belt 121) by the BU table 150 lifted from the withdrawal position to the operating position. The substrate W is then clamped by the pair of clamp members 160 by the clamp members 160 displaced from the withdrawal position to the forward position. The clamping of the substrate W by the clamp unit 14 may be carried out, for instance, until the first substrate support table 10A reaches the sending position in this embodiment.

Figure 12A:
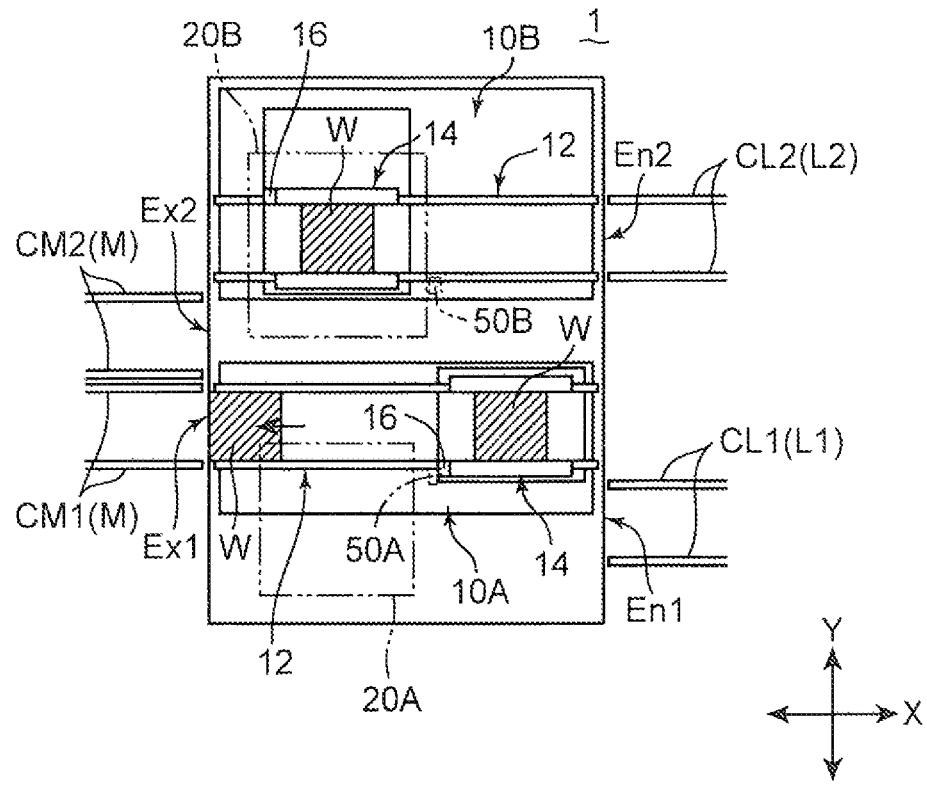
FIGS. 12A and 12B are schematic plan views explaining the printing operation of the screen printing apparatus based on the control of the control device, and showing the printing operation in a time series.

When the first substrate support table 10A reaches the sending position, the conveyer pair 12 is driven, so that the printed preceding substrate W is consequently sent out from the first substrate support table 10A to the component mounting device M at the first substrate unloading part Ex1 (FIG. 12A).

When the printed preceding substrate W is sent out from the first substrate support table 10A, the conveyer pair 12 is stopped. The first substrate support table 10A moves from the sending position toward the receiving position in the Y axis direction, and the clamp unit 14 synchronously moves from the substrate standby position P1 toward the print executing position P2 in the X axis direction. At this timing, the first substrate support table 10A and the clamp unit 14 are controlled so that the plurality of signs indicated on the substrate W sequentially go through the lower position of the first substrate recognition camera 50A and the mask recognition camera 16 passes through the lower position of the signs indicated on the lower face of the mask 21. Consequently, the positions of the substrate W and the mask 21 are subjected to image recognition. Based on the image recognition results of the substrate W and the mask 21, the position gap of the substrate W and the mask 21 is obtained at a timing when the substrate W is displaced at the print executing position P2. Correction values (ΔX, ΔY, ΔR) of the X axis, Y axis and R axis (around Z axis) directions according to the obtained position gap are also obtained. The foregoing recognition processing and calculation of correction values are performed by the control device 8 based on the images that have been imaged by the substrate recognition camera 50 and the mask recognition camera 16. In this embodiment, for instance, the clamp unit 14 is controlled so that the substrate W is disposed at the print executing position P2 on the first substrate support table 10A at the point in time that the first substrate support table 10A reaches the receiving position.

Figure 12B:
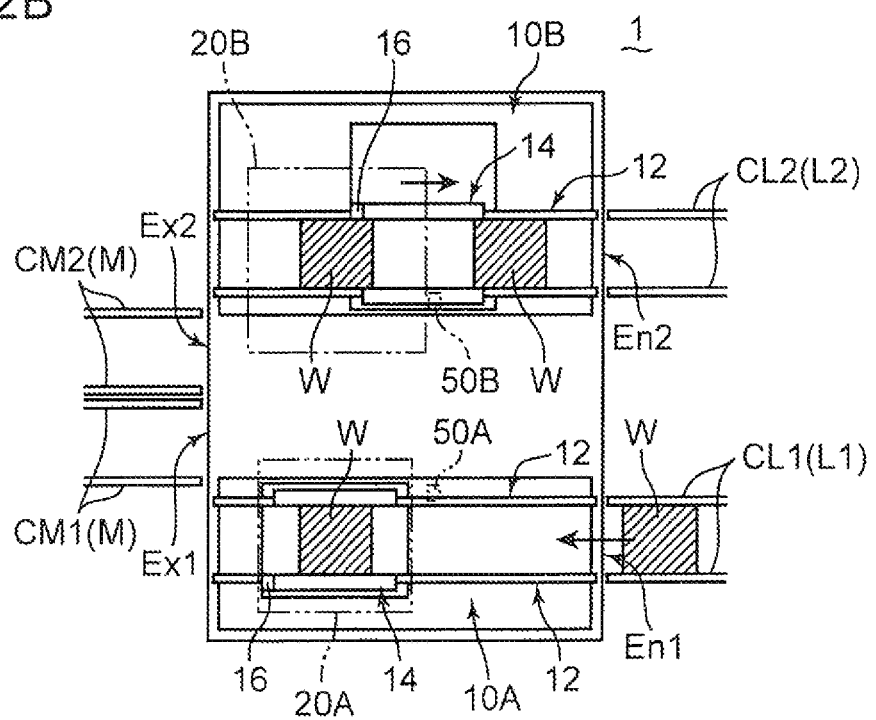

Subsequently, as shown in FIG. 12B, when the first substrate support table 10A reaches the receiving position, the first print executing part 20A performs printing on the substrate W. During that time, the subsequent substrate W is received on the first substrate support table 10A in the first substrate loading part En1 and disposed at the substrate standby position P1 by the drive of the conveyer pair 12. In this operation, since the substrate W of the print executing position P2 is clamped by the clamp unit 14 in a state of being raised from the conveyer pair 12, the substrate W at the print executing position P2 will not cause any position gap due to the reception of the subsequent substrate W.

In the printing of the substrate W by the first print executing part 20A, foremost, the mask support member 24 is lowered from the withdrawal position to the overlapping height position, and the mask 21 consequently is placed atop the substrate W. In a state where the first substrate support table 10A is disposed at the first receiving position, the mask 21 is appropriately overlapped with the substrate W caused by the respective position adjustments being performed by the motor 144 based on the correction values (ΔX, ΔY, ΔR). Namely, the position of the substrate W on the substrate support table 10A being corrected in the X axis direction in the amount of the correction value ΔX, the position adjustment (correction value ΔY) of the mask 21 in the Y axis direction, and the position adjustment (correction value ΔR) of the mask 21 in the R axis direction being performed based on the drive of the two motors 30, respectively.

Subsequently, when the overlapping of the mask 21 with the substrate W disposed at the print executing position P2 is complete, the squeegee 42 is moved from the withdrawal position to the printing work height position, and the overall squeegee unit 40 including the squeegee 42 is thereafter moved in the Y axis direction so as to perform printing on the substrate W.

The operation of the first substrate support table 10A from the state shown in FIG. 11A has been explained. The second substrate support table 10B is also operated in such a way that, as shown in FIG. 11B and FIGS. 12A and 12B, the substrate W is received in the second substrate loading part En2, as well as the first substrate support table 10A, with a given time difference with respect to the first substrate support table 10A. The substrate W is subjected to printing. The substrate W is then moved to the unloading side end on the conveyer pair 12 corresponding to a side of the second substrate unloading part Ex2 of the substrate W. The second substrate support table 10B is moved to the sending position in the Y axis direction, and the substrate W is sent out of the component mounting device M in the second substrate unloading part Ex2. Consequently, the printing of the substrate W is being performed alternately in the respective print executing parts 20A, 20B, and the substrate W is unloaded to the component mounting device M.

As described above, according to the printing apparatus 1, the subsequent substrate W is disposed at the print executing position P2 at the point in time that the substrate support tables 10A, 10B are reset to the receiving position after sending out the printed preceding substrate W from the substrate support tables 10A, 10B to the component mounting device M at the sending position. Since the image recognition of the subsequent substrate W (signs) by the substrate recognition cameras 50A, 50B and the image recognition of the mask 21 by the mask recognition camera 16 are performed in the course of resetting the substrate support tables 10A, 10B from the sending position to the receiving position as described above, printing by the print executing parts 20A, 20B is started immediately from the point in time that the substrate support tables 10A, 10B are reset to the receiving position. Therefore, according to the printing apparatus 1, in comparison to the conventional apparatus described in Japanese Patent Application Publication No. 2009-70867 explained in the Background section, the printing of the subsequent substrate W can be started quickly after the printing of the preceding substrate W is complete.

Figure 13:
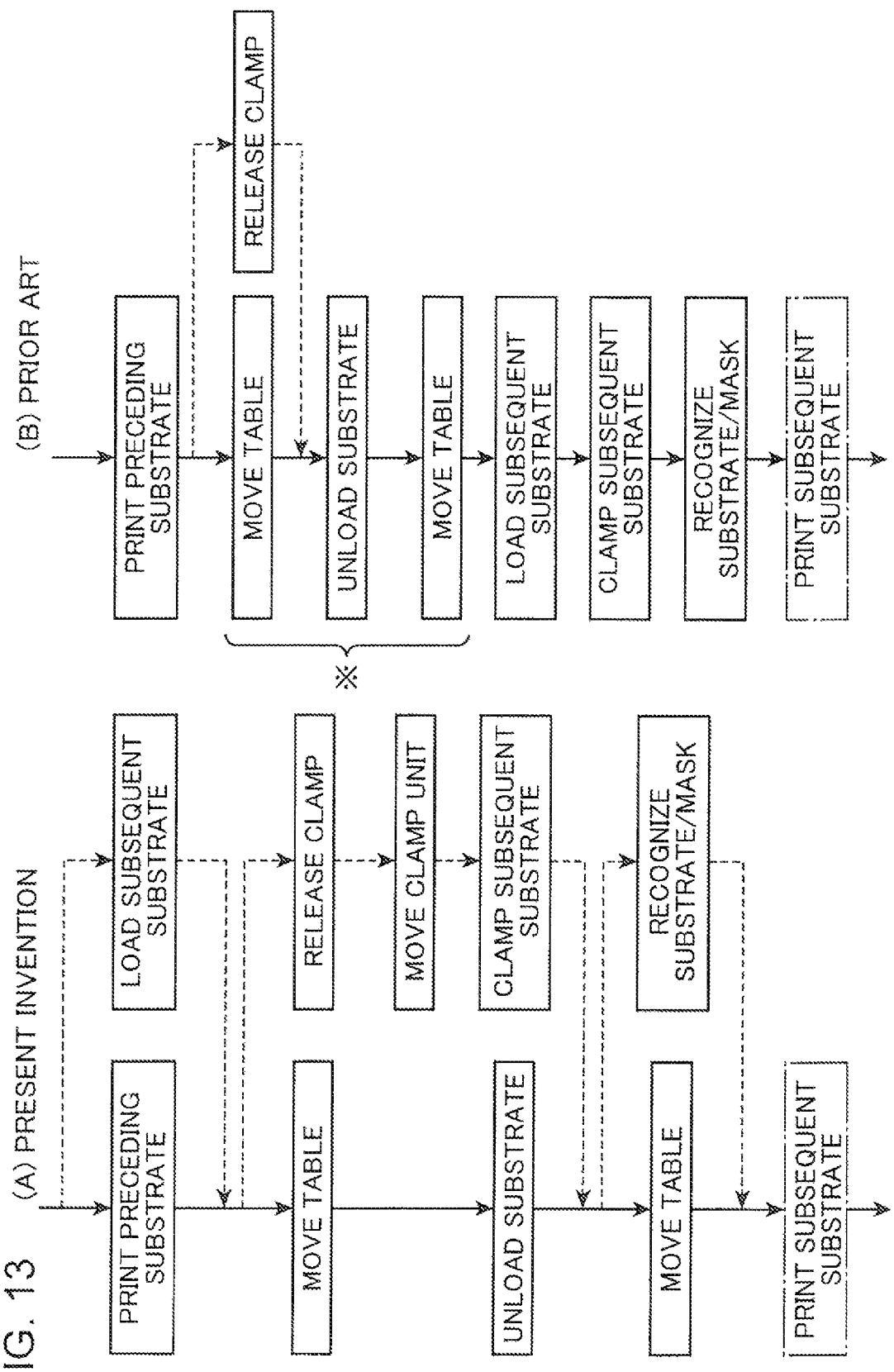
FIG. 13 is a flowchart comparing the operation of the screen printing apparatus according to the present disclosure portion (A) and the operation of a conventional apparatus portion (B).

FIG. 13 is a flowchart comparing the operation of the printing apparatus 1 (A) and the operation of a conventional apparatus (B). As shown in (B) of FIG. 13, the conventional apparatus performs the steps of printing the preceding substrate, moving the substrate support table (stage) to the unloading position, unloading the substrate, moving the substrate support table to the substrate receiving position, loading the subsequent substrate, clamping the subsequent substrate, and recognizing the substrate and the mask recognition in order. Meanwhile, in the printing apparatus 1, as shown in (A) of FIG. 13, the loading of the subsequent substrate W to the substrate support tables 10A, 10B is performed during the printing of the preceding substrate W, the subsequent substrate W is clamped while the substrate support tables 10A, 10B are moved to the sending position to unload the preceding substrate W and reset to the receiving position, the moving of the substrate W on the substrate support tables 10A, 10B from the substrate standby position P1 to the print executing position P2 is started, and during this move, the image recognition of the substrate W and the mask 21 is performed, and the subsequent substrate W is disposed at the print executing position P2. That is, according to the printing apparatus 1, the preparation for printing the subsequent substrate W is basically completed within the processes within (B) of FIG. 13. Thus, according to the printing apparatus 1, the time from the printing completion of the preceding substrate W to the printing starting of the subsequent substrate W can be considerably shortened in comparison to a conventional apparatus. Consequently, it is possible to improve the throughput and contribute to the improvement in the productivity of printed circuit boards.

Moreover, utilizing the configuration in which the substrate support tables 10A, 10B move in the Y axis direction and the clamp unit 14 moves in the X axis direction, respectively in the printing apparatus 1, the substrate recognition cameras 50A, 50B image the substrate W (signs) in a state of being fixed to the apparatus frame 6, and the mask recognition camera 16 is mounted on the clamp unit 14 so that the mask recognition camera 16 is moved two-dimensionally to image the mask 21 (signs). Namely, in the printing apparatus 1, a dedicated drive mechanism for moving the substrate recognition cameras 50A, 50B and the mask recognition camera 16 is not required and therefore there is an advantage in that the image recognition of the substrate W and the mask 21 can be performed with an economic configuration.

In the printing apparatus 1, the transfer of the substrate W from the substrate loading parts En1, En2 (loading side end) to the substrate standby position P1 and the transfer of the substrate W from the print executing position P2 to the substrate unloading parts Ex1, Ex2 (unloading side end) are performed with the common conveyer pair 12. Needless to say, however, the conveyer pair for transferring the substrate W from the substrate loading parts En1, En2 to the substrate standby position P1 and the conveyer pair for transferring the substrate W from the print executing position P2 to the substrate unloading parts Ex1, Ex2 may be provided separately and independently.

The second embodiment of the screen printing apparatus according to the present disclosure is now explained with reference to FIG. 14 and FIG. 15.

Figure 14:
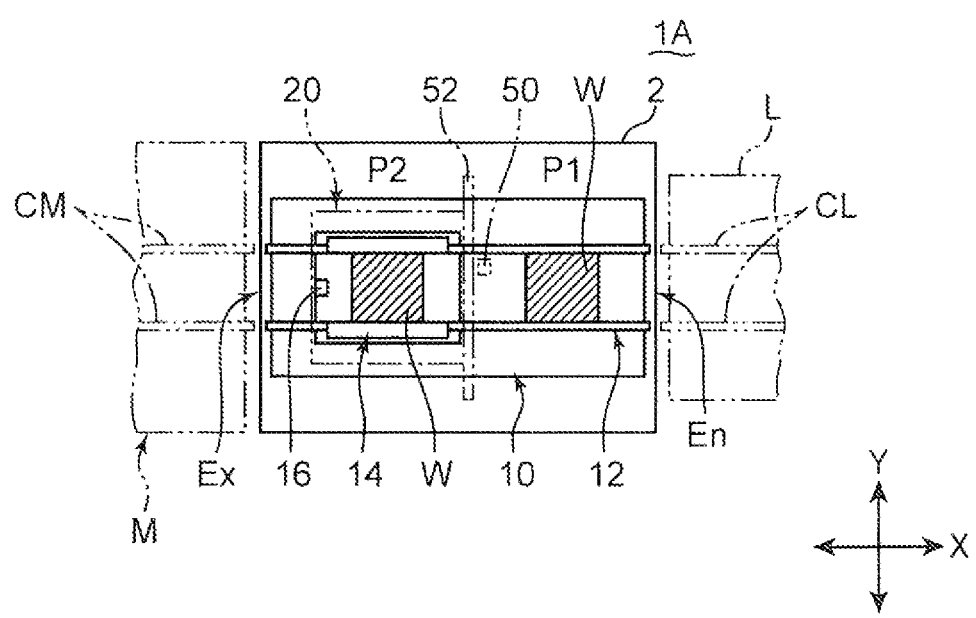
FIG. 14 is a schematic plan view showing a second embodiment of the screen printing apparatus according to the present disclosure.

FIG. 14 is a plan view schematically showing the screen printing apparatus 1A (hereinafter abbreviated as the "printing apparatus 1A") according to the second embodiment. The printing apparatus 1A according to the second embodiment is built into the manufacturing line of the printed circuit board (PCB) in a state of interlocking a single transfer-type component mounting device M at the downstream side. The configuration differs from the printing apparatus 1 of the first embodiment with respect to the following points. In the illustrated example, the printing apparatus 1A is interposed between one loader L and the single transfer-type one component mounting device M. The printing apparatus 1A performs printing on a substrate W sent out from the upstream loader L, and the printing apparatus 1A subsequently sends out the printed substrate W to the downstream component mounting device M.

In the printing apparatus 1A, the substrate loading part, the substrate unloading part, the substrate support table, and the print executing part are all provided as one unit each. After the substrate W loaded from the loader L in the substrate loading part En is received by the substrate support table 10 and printing is performed to that substrate W, the printed substrate W is sent out from the substrate support table 10 to the component mounting device M in the substrate unloading part Ex. Although the substrate unloading part Ex is not offset in the Y axis direction relative to the substrate loading part En in the printing apparatus 1A, the substrate support table 10 is movably provided in the Y axis direction as well as the first embodiment.

Also, the substrate recognition camera 50 is provided as one unit in the printing apparatus 1A. The substrate recognition camera 50 is interlocked with the camera drive mechanism 52 to be able to move in the Y axis direction. Although the camera drive mechanism is not illustrated in detail, it is configured, for example, from a screw feeding mechanism. That is, the substrate recognition camera 50 is movably supported on a fixed rail mounted on the apparatus frame 6, and is driven by a motor via a screw axis.

The electrical configuration of the printing apparatus 1A is substantially the same as the first embodiment (refer to FIG. 10) except that only one substrate support table and one print executing part are provided.

In the printing apparatus 1A, the printing of the substrate W disposed at the print executing position P2 is performed by the print executing part 20 in a state where the substrate W is disposed at the print executing position P2 and the substrate standby position P1, respectively as shown in the figure.

Figure 15A:
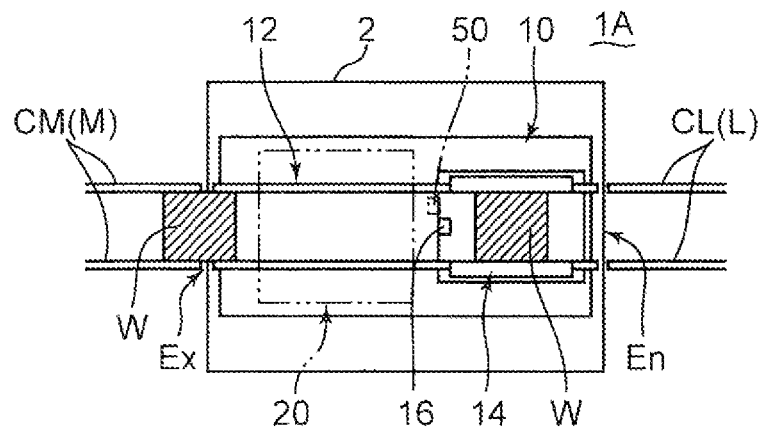
FIGS. 15A, 15B, and 15C are schematic plan views explaining the printing operation of the screen printing apparatus according to the second embodiment based on the control of the control device, and showing the printing operation in a time series.

When the printing is complete, the clamped state of the clamp unit 14 is released and the printed preceding substrate W is delivered to the conveyer pair 12, so that the substrate W is consequently sent out by the conveyer pair 12 to the component mounting device M from the print executing position P2 via the substrate unloading part Ex. Meanwhile, the clamp unit 14 after being unclamped moves to the substrate standby position P1. After stopping, the clamp unit 14 clamps the subsequent substrate W in a standby state (FIG. 15A). In this process, although the conveyer pair 12 is driven in sync with the unclamping of the printed preceding substrate W, the subsequent substrate W is maintained in a standby state by the stopper mechanism 15, so that the clamping of the subsequent substrate W by the clamp unit 14 can be stably performed.

For the positioning of the mask 21 and the substrate W for the printing, the substrate support table 10 may be displaced at a position which is Y axis directionally apart from a predetermined reference position, or a position where the substrate support table 10 enables receiving the substrate W from the loader L in the substrate loading part En and to send the substrate W to the component mounting device M in the substrate unloading part Ex. In that case, the substrate support table 10 is reset to the reference position after completing the printing and before the unclamping of the preceding substrate W.

Figure 15B:
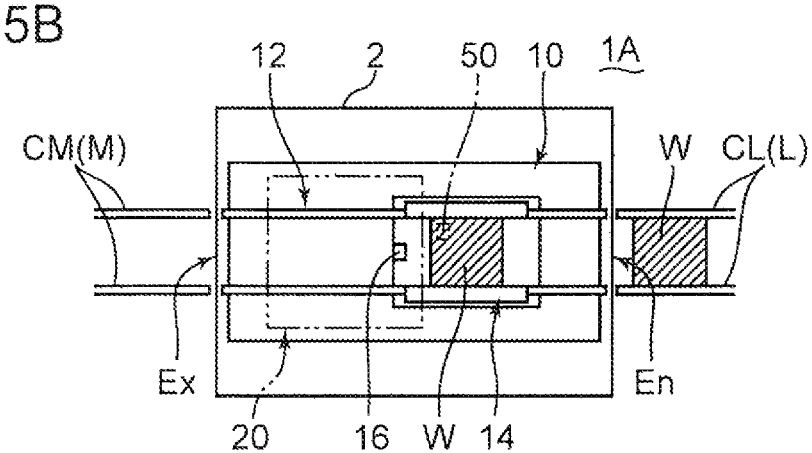
Figure 15C:
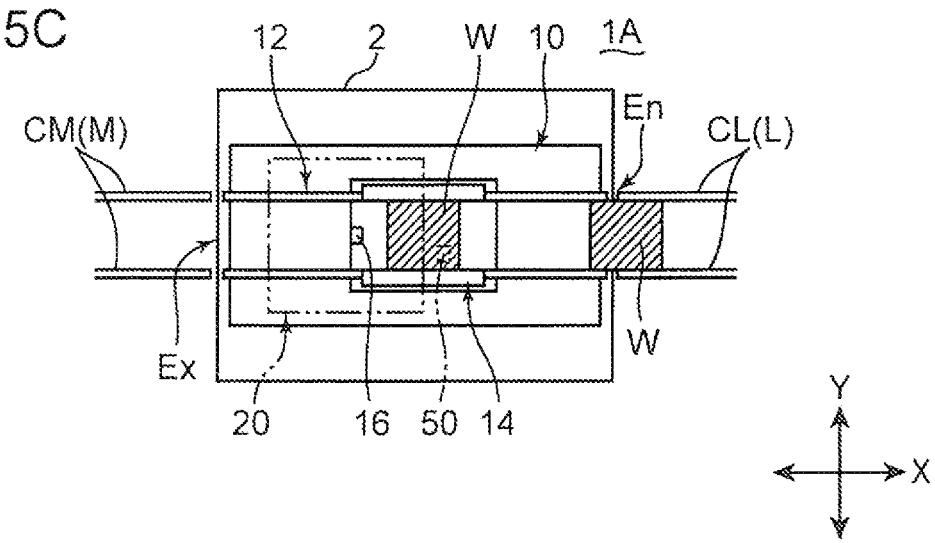

When the clamping of the subsequent substrate W by the clamp unit 14 is completed, the subsequent substrate W is transferred from the substrate standby position P1 to the print executing position P2 accompanying with the movement of the clamp unit 14. Meanwhile, the substrate W is received on the substrate support table 10 in the substrate loading part En (FIG. 15B). In the cause of the process, the substrate recognition camera 50 moves in the Y axis direction, so that the signs on the substrate W are imaged by the substrate recognition camera 50. Meanwhile, the substrate support table 10 also moves in the Y axis direction. Therefore, the signs on the lower face of the mask 21 are imaged and recognized by the mask recognition camera 16. The correction values ($\Delta X$, $\Delta Y$, and $\Delta R$) are obtained based on the image recognition results of the substrate W and the mask 21. For example, in a case where signs are respectively indicated at the diagonal corners of the substrate W, the signs are sequentially imaged by the substrate recognition camera 50 by the movement of the substrate recognition camera 50 to a position on the signs in accordance with the movement of the clamp unit 14 (substrate W), as shown in FIGS. 15B and 15C.

Subsequently, when the substrate W held by the clamp unit 14 reaches the print executing position P2, the substrate support table 10 that moved in the Y axis direction is moved in the Y axis direction so that it returns to its original position for the signs on the lower face of the mask 21 mounted detachably to an un-shown frame which is interlocked with and fixed to the foundation 2. As the substrate support table 10 is turnable at a predetermined angle around the Z axis (R axis direction) that runs through the center of the mask 21, the substrate support table 10 is turned by an amount of the correction value $\Delta R$. The substrate W is held by the clamp unit 14 on the substrate support table 10 that turns as described above. The correction value $\Delta Y1$ of the substrate support table 10 in the Y axis direction and the correction value $\Delta X1$ of the moving direction of the clamp unit 14 with respect to the substrate support table 10 are respectively calculated based on the correction value $\Delta R$, the correction value $\Delta X$, and the correction value $\Delta Y$. Based on the foregoing calculated values, the clamp 14 is moved by an amount of the correction value $\Delta X1$, and the substrate support table is moved in the Y axis direction by an amount of the correction value $\Delta Y1$. Subsequently, the substrate support table 10 that is elevatable relative to the foundation 2 is raised to put the substrate W beneath the mask 21. Printing to the substrate W by the first print executing part 20A is thereby performed. The printing operation to the substrate W by the print executing part 20 is the same as the printing apparatus 1 of the first embodiment, so the explanation thereof is omitted.

According to the printing apparatus 1A of the second embodiment described above, the configuration is such that the substrate W is held by the clamp unit 14 in advance at the substrate standby position P1 at an upstream side that is closer than the print executing position P2 in a state such that the substrate is printable by the print executing part 20, and the substrate W (signs) is imaged by the substrate recognition camera 50, and the mask 21 (signs) is imaged by the mask recognition camera 16 while the substrate W is being transferred from the substrate standby position P1 to the print executing position P2. Therefore, the printing of the substrate W can be performed efficiently in comparison to the cases (in conventional apparatuses described in Japanese Patent Publication No. 2682145 and Japanese Patent Application Publication No. 2009-70867 explained in the Background section) where the substrate is imaged after the substrate is once disposed at the print executing position and thereafter the substrate is moved to the imaging position on the print executing position side, or the cases where the substrate or mask is imaged at the print executing position by operating the movable camera after the substrate is moved at the print executing position. That is, in the case where the substrate or the mask is imaged after once the substrate is disposed at the print executing position, a step of imaging the substrate or the like must be done separately from the step of transferring the substrate to the print executing position. However, according to the printing apparatus 1A, since the transfer of the substrate W to the print executing position P2 and the imaging of the substrate W or the like are performed in parallel, the cycle time can be shortened by that much.

In addition, since the clamp unit 14 returns to the substrate standby position P1 and holds the subsequent substrate W and transfers it to the print executing position P2 during the time the printed preceding substrate W is being sent out to the component mounting device M in the substrate unloading part Ex after completing the printing, the printing of the subsequent substrate W can be started in a short period of time in comparison to the case of receiving the subsequent substrate from the loader L in the substrate loading part from the point in time that the printed substrate W has been completely transferred in the substrate unloading part, and the cycle time can also be shortened with respect to this point.

Thus, according to the printing apparatus 1A of the second embodiment, in comparison to a conventional apparatus screen printing apparatus (for instance, the conventional apparatus described in Japanese Patent Publication No. 2682145 explained in the Background section) in which a single transfer-type component mounting device or the like is disposed on the downstream side, it is possible to improve the throughput and contribute to the improvement in the productivity of printed circuit boards.

The third embodiment of the screen printing apparatus according to the present disclosure is now explained with reference to FIG. 16.

Figure 16A:
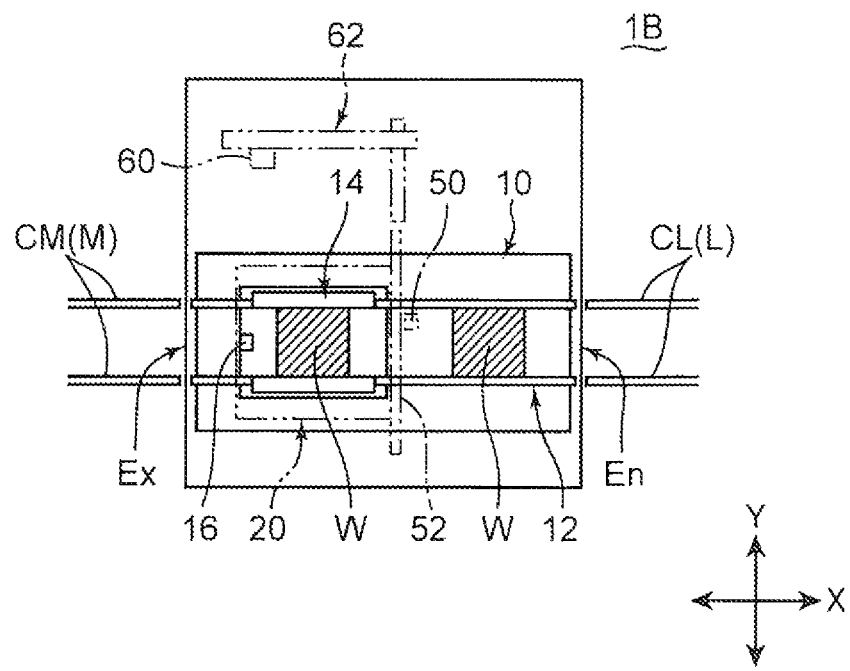
FIGS. 16A and 16B are schematic plan views showing a third embodiment of the screen printing apparatus according to the present disclosure, and showing the printing operation in a time series.

FIG. 16A is a schematic plan view showing the screen printing apparatus 1B (hereinafter abbreviated as the "printing apparatus 1B") according to the third embodiment. The printing apparatus 1B according to the third embodiment is a modified example of the printing apparatus 1A (refer to FIG. 14) of the second embodiment described above, and is configured differently from the printing apparatus 1A of the second embodiment with respect to the following points. That is, the printing apparatus 1B is a printing apparatus with an inspection function which comprises an inspection camera 60 for inspecting the printed state of the printed substrate W at a side position of the print executing position P2, and a camera drive mechanism 62 comprises an X-Y robot for moving the inspection camera 60 two-dimensionally.

The substrate support table 10 is movable only in the Y axis direction as well as the substrate support table 10A according to the first embodiment. The configuration around the mask not shown of the print executing part 20 is the same as the mask 21 according to the first embodiment, so that the mask is movable in the X axis direction, the R axis direction and the Z axis direction. As the result, as well as the mask recognition camera 16 and the substrate recognition camera 50 according to the second embodiment, the mask (signs) is imaged by the mask recognition camera 16, and the substrate W (signs) is imaged by the substrate recognition camera 50. Based on correction values (ΔX, ΔY, ΔR) which are obtained from the foregoing results, the position of the substrate support table 10 is moved in an amount of the correction value ΔY, the position of the mask is moved in an amount of the correction value ΔX, and the mask is rotated in an amount of the correction value ΔR, as well as the first embodiment. After the foregoing processes, the mask is put beneath the substrate W from below.

Figure 16B:
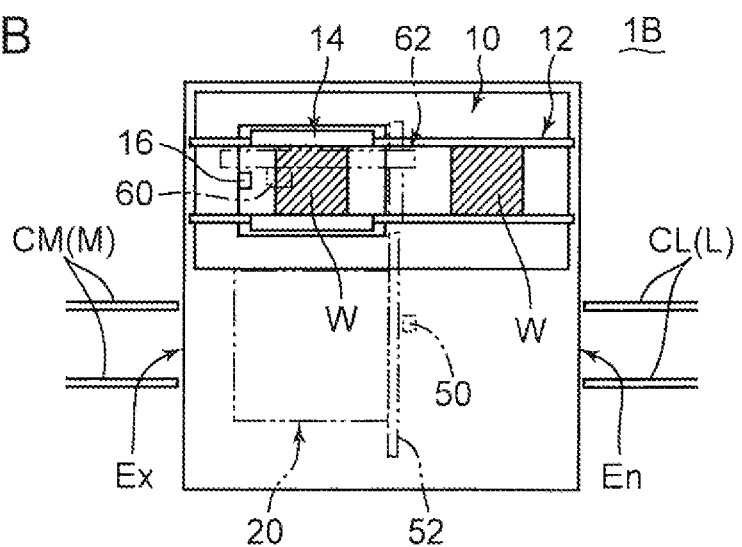

Most of the printing operation of the printing apparatus 1B is common with the printing apparatus 1A of the second embodiment. The printing apparatus 1B is configured such that once the substrate support table 10 moves the inspection executing position on the side of the print executing part 20 after completing the printing, as shown in FIG. 16B, imaging of the printed location is performed by the inspection camera 60, and the substrate support table 10 thereafter returns to the reference position and unloads the printed preceding substrate W. Accordingly, the electrical configuration (control device 8) of the printing apparatus 1B is also substantially the same as that of the printing apparatus 1A of the second embodiment.

According to the printing apparatus 1B of the third embodiment described above, while efficiently performing the printing of the substrate W, it is further possible to inspect the substrate W within the printing apparatus 1B and then unload the substrate W to the component mounting device M. Thus, it is possible to prevent such a drawback that a print-defective substrate W is directly sent to the component mounting device M, and there is an advantage in that the functionality of the printing apparatus 1B can be improved.

According to the printing apparatuses 1, 1A, 1B of the first to third embodiments described above, the control device 8 controls the clamp unit 14 (transferring and holding means) so that the clamp unit 14 holds the subsequent substrate W moving the substrate standby position P1 (specific position) after delivering the printed preceding substrate W, and the clamp unit 14 transfers the subsequent substrate W to the print executing position P2. Correspondingly, the control device 8 controls the conveyer pair 12 so that the subsequent substrate W reaches the substrate standby position P1 after the delivery of the preceding substrate W and before the clamp unit 14 reaches the substrate standby position P1, and the preceding substrate W is transferred more downstream than the print executing position 20 before the subsequent substrate W which is transferred by the clamp unit 14 reaches the print executing position P2. That is, the transfer of the printed preceding substrate W to the substrate unloading parts Ex, EX1, Ex2 and the transfer of the subsequent substrate W in a standby state from the substrate standby position P1 to the print executing position P2 are carried out in parallel. Thus, the cycle time can be shortened even more.

Meanwhile, the foregoing screen printing apparatuses 1, 1A, 1B are merely illustrations of preferred embodiments of the screen printing apparatus according to the present disclosure, and the specific configuration thereof may be modified as needed to the extent that such modification does not deviate from the gist of the present disclosure. For example, the specific supporting structure of the substrate W in the substrate support tables 10, 10A, 10B, the specific holding structure of the mask 21 in the print executing parts 20, 20A, 20B, or the specific structure of the squeegee unit 40 is not necessarily limited to those of the screen printing apparatuses 1, 1A, 1B of the foregoing embodiments, and may be modified as needed.

Moreover, with the screen printing apparatus 1 of the first embodiment described above, specific positions on the foundation 2 based on a print execution program are set as the substrate loading parts En1, En2 and the substrate unloading parts Ex1, Ex2. However, for instance, it is also possible to dispose a loading conveyer capable of receiving a substrate W from the loaders L1, L2 at the upstream side on the foundation 2 and use the loading conveyer as the substrate loading parts En1, En2, and dispose an unloading conveyer capable of sending a substrate to the component mounting device M at the upstream side and use the unloading conveyer as the substrate unloading parts Ex1, Ex2. The same applied to the other screen printing apparatuses 1A, 1B described above.

The disclosure described above can be summarized as follows.

That is, the screen printing apparatus according to one aspect of the present disclosure comprises a print executing part that is placed between a substrate loading position and a substrate unloading position aligned in a specific direction, the printing executing part performs screen printing on a substrate using a screen mask, transferring and holding means, said transferring and holding means transferring the substrate loaded from the substrate loading position to a print executing position at which the print executing part enables performing of printing, and the transferring and holding means holding the substrate during the printing, and substrate imaging means for imaging the substrate held by the transferring and holding means before printing is performed by the print executing part, wherein the transferring and holding means receives the substrate at a specific position that is closer to a substrate loading position side than the print executing position, and the transferring and holding means transfers the substrate from the specific position to the print executing position in advance upon holding the substrate in a state such that the substrate is printable by the print executing part, and wherein the substrate imaging means is disposed at a position where the substrate imaging means enables imaging the substrate in the course of the transfer of the substrate from the specific position to the print executing position by the transferring and holding means.

According to the foregoing screen printing apparatus, the substrate is transferred from the specific position to the print executing position in a state that the substrate is held in advance by the transferring and holding means at the specific position that is closer to a substrate loading position side than the print executing position so that the substrate is printable by the print executing part. Then, a picture of the substrate is taken by the substrate imaging means while the substrate is being transferred from the specific position to the print executing position. According to the aforementioned screen printing apparatus, an independent process for imaging the substrate is not required. Rather, the transfer of the substrate to the print executing position and the imaging of the substrate are performed in parallel. Therefore, the cycle time can be effectively shortened in comparison to a conventional apparatus, or the like, which requires an independent process for imaging the substrate, such as an apparatus or the like which once loads a substrate at a print executing position and fixes the substrate with a clamp device, and thereafter moves the substrate, together with the clamp device, to the imaging position on the print executing position side, and thereby images the substrate. Accordingly, the present disclosure can improve the throughput and contribute to the improvement in the productivity of printed circuit boards.

More specifically, a standby space that allows a subsequent substrate to standby is defined to a substrate loading position side which is closer than the print executing position, and wherein a position located at the standby space is defined as the specific position, the screen printing apparatus further comprises: transferring means that is separate from the transferring and holding means, said transferring means transferring the substrate loaded from the substrate loading position to the specific position and causing the substrate to standby, said transferring means also receiving a printed substrate from the transferring and holding means, and said transferring means transferring the printed substrate to the substrate unloading position; and control means for controlling the transferring and holding means and the transferring means, wherein the control means controls the transferring and holding means so that the transferring and holding means moves to the specific position and holds a subsequent substrate after the transferring and holding means delivers a printed preceding substrate to the transferring means, and the transferring and holding means transfers the subsequent substrate to the print executing position, and the control means also controls the transferring means so that the subsequent substrate reaches the specific position after the delivery of the preceding substrate and before the transferring and holding means reaches the specific position, and the control means further controls the transferring means so that the preceding substrate is transferred more downstream than the print executing position before the subsequent substrate is transferred by the transferring and holding means and the preceding substrate reaches the print executing position.

According to the foregoing screen printing apparatus, since the transfer of the printed preceding substrate to the substrate unloading part and the transfer of the subsequent substrate in standby from the specific position to the print executing position are carried out in parallel, the cycle time can be shortened even more.

In a screen printing apparatus, the foregoing effect can also be enjoyed where the substrate loading position and the substrate unloading position are offset in a direction that is orthogonal to a certain direction. Such an object can be achieved with the following configuration. That is, the screen printing apparatus further comprises a movable table on which the transferring and holding means and the transferring means are mounted, the movable table being provided movably in a direction that is orthogonal to the specific direction between a receiving position where it is possible to receive a substrate loaded from the substrate loading position, and a sending position where it is possible to send a printed substrate from the substrate unloading position, a predetermined position on the substrate loading position side on the movable table is defined as the specific position, and a predetermined position on a substrate unloading position side is defined as the print executing position, wherein the print executing part is disposed at a position where the print executing part enables performing of printing on a substrate disposed at the print executing position when the movable table is in a state that the movable table is disposed at the receiving position, and wherein the control means further controls the movable table so that the movable table is moved from the receiving position to the sending position after printing of the preceding substrate is complete. The preceding substrate is sent from the movable table to the substrate unloading position caused by the transfer of this preceding substrate by the transferring means. The movable table is moved to the receiving position after sending the preceding substrate.

According to the foregoing screen printing apparatus, the substrate loaded from the substrate loading position is received on the movable table disposed at the receiving position. Printing by the print executing part is possible in a state that the substrate is held by the transferring and holding means mounted on the movable table. After completing the printing, the movable table is disposed at the sending position, thereby the printed substrate is sent out to the substrate unloading position.

In the foregoing configuration, the control means controls the movable table and the transferring and holding means so that the subsequent substrate held by the transferring and holding means is disposed at the print executing position at a point in time that the movable table reaches the receiving position after the preceding substrate is sent to the substrate unloading position.

According to the foregoing configuration, since the printing of the substrate by the print executing part can be started immediately after the movable table is reset from the sending position to the receiving position, this is effective in shortening the cycle time.

In each of the screen printing apparatuses, the substrate imaging means may be movably provided in a direction that is orthogonal to a transfer direction of a subsequent substrate by the transferring and holding means.

According to the foregoing configuration, the imaging area is expanded by moving the substrate imaging means in the same direction, and the freedom of the imaging position on the substrate will increase.

Moreover, the transferring and holding means may include a substrate holding member for holding a substrate, and moving means for moving the substrate holding member between the specific position and the print executing position, and mask imaging means for imaging the screen mask may be mounted on the substrate holding member.

According to the foregoing configuration, the mask can be imaged with the mask recognition camera while the substrate is being transferred from the specific position to the print executing position. Moreover, a reasonable configuration can be achieved, wherein the substrate holding member serves as a means for moving the mask recognition camera.

INDUSTRIAL APPLICABILITY

As described above, the screen printing apparatus according to the present disclosure can shorten the cycle time by performing the transfer of the substrate to the print executing position and the imaging of the substrate in parallel with regard to the recognition of the substrate prior to the printing work, and is useful in the field of manufacturing component mounted substrates.

The invention claimed is:
1. A screen printing apparatus, comprising:
a print executing part placed between a substrate loading position and a substrate unloading position aligned in a specific direction, the printing executing part being configured to perform screen printing on a substrate using a screen mask;

a transferring and holding device configured to receive a substrate at a specific position that is defined at a standby space defined at a substrate loading position side which is closer to the substrate loading position than a print executing position at which the print executing part enables printing on the substrate, the transferring and holding device being configured to transfer the substrate to the print executing position, and the transferring and holding device being further configured to hold the substrate during the printing;

a transferring device configured to transfer the substrate loaded from the substrate loading position to the specific position and causing the substrate to standby, the transferring device also being configured to receive a printed substrate from the transferring and holding device, and the transferring device being further configured to transfer the printed substrate to the substrate unloading position;

a substrate imaging device being configured to image the substrate held by the transferring and holding device before printing is performed by the print executing part; and a control unit configured to control the transferring and holding device and the transferring device, the transferring and holding device being configured to receive the substrate at the specific position, and the transferring and holding device being configured to transfer the substrate from the specific position to the print executing position upon holding the substrate in advance in a state such that the substrate is printable by the print executing part, the substrate imaging device being disposed at a position where the substrate imaging device enables imaging of the substrate in the course of the transfer of the substrate from the specific position to the print executing position by the transferring and holding device, and the control unit controlling the transferring and holding device so that the transferring and holding device moves to the specific position and the transferring and holding device holds a subsequent substrate after the transferring and holding device delivers a printed preceding substrate to the transferring device, and the transferring and holding device transferring the subsequent substrate to the print executing position, and the control unit also controlling the transferring device so that the subsequent substrate reaches the specific position after the delivery of the preceding substrate and before the transferring and holding device reaches the specific position, and the control unit further controlling the transferring device so that the preceding substrate is transferred more downstream than the print executing position before the subsequent substrate is transferred by the transferring and holding device and reaches the print executing position.

2. The screen printing apparatus according to claim 1, wherein the substrate loading position and the substrate unloading position are offset in a direction that is orthogonal to the specific direction, wherein the screen printing apparatus further comprises a movable table on which the transferring and holding device and the transferring device are mounted, the movable table being movably provided in a direction that is orthogonal to the specific direction between a receiving position where it is possible to receive a substrate loaded from the substrate loading position, and a sending position where it is possible to send a printed substrate from the substrate unloading position, a predetermined position on the substrate loading position side on the movable table is defined as the specific position, and a predetermined position on a substrate unloading position side is defined as the print executing position, wherein the print executing part is disposed at a position where the print executing part enables printing on a substrate disposed at the print executing position when the movable table is in a state that the movable table is disposed at the receiving position, and wherein the control unit further controls the movable table and transferring device so that the movable table is moved from the receiving position to the sending position after printing of the preceding substrate is complete, the preceding substrate is sent from the movable table to the substrate unloading position caused by the transfer of the preceding substrate by the transferring device, and the movable table is moved to the receiving position after sending the preceding substrate.

3. The screen printing apparatus according to claim 2, wherein the control unit controls the movable table and the transferring and holding device so that the subsequent substrate held by the transferring and holding device is disposed at the print executing position at a timing when the movable table reaches the receiving position after the preceding substrate is sent to the substrate unloading position.

4. The screen printing apparatus according to claim 1, wherein the substrate imaging device is movably provided in a direction that is orthogonal to a transfer direction of a subsequent substrate by the transferring and holding device.

5. The screen printing apparatus according to claim 1, wherein the transferring and holding device includes a substrate holding member that holds a substrate, and a mover configured to move the substrate holding member between the specific position and the print executing position, and wherein the substrate holding member is provided with a mask imaging device configured to image the screen mask.

6. The screen printing apparatus according to claim 1, further comprising first and second units for aligned printing in a direction orthogonal to the specific direction, each of the units for printing is defined as a printing unit that includes the print executing part, the transferring and holding device and the transferring device form the printing unit, wherein the control unit controls the transferring and holding device and the transferring device of the respective printing units.

7. The screen printing apparatus according to claim 6, wherein the substrates are respectively loaded from a first substrate loading position and a second substrate loading position, both of which are defined as the substrate loading position, that are aligned in an orthogonal direction orthogonal to the specific direction, the substrates are respectively unloaded from a first substrate unloading position and a second substrate unloading position, both of which are defined as the substrate unloading position, that are placed between the first substrate loading position and the second substrate loading position in the orthogonal direction and aligned in an orthogonal direction orthogonal to the specific direction, wherein the first printing unit includes a first print executing part, a first transferring and holding device and a first transferring device, the first printing unit further including a first movable table on which the first transferring and holding device and the first transferring device are mounted, the first movable table being movably provided in the orthogonal direction between a first receiving position where it is possible to receive a substrate loaded from the first substrate loading position, and a first sending position where it is possible to send a printed substrate from the first substrate unloading position, wherein a predetermined position on a first substrate loading position side on the first movable table is defined as the specific position and a predetermined position on a first substrate unloading position side is defined as the print executing position, and the first print executing part is disposed at a position where the print executing position enables printing on a substrate disposed at the print executing position when the movable table is in a state where the first movable table is disposed at the first receiving position, wherein the second printing unit includes a second print executing part, a second transferring and holding device and a second transferring device, the second printing unit further includes a second movable table on which the second transferring and holding device and the second transferring device are mounted, the second movable table being movably provided in the orthogonal direction between a second receiving position where it is possible to receive a substrate loaded from the second substrate loading position, and a second sending position where it is possible to send a printed substrate from the second substrate unloading position, wherein a predetermined position on a second substrate loading position side on the second movable table is defined as the specific position and a predetermined position on a second substrate unloading position side is defined as the print executing position, and the second print executing part is disposed at a position where the print executing position enables printing on a substrate disposed at the print executing position when the movable table is in a state where the second movable table is disposed at the second receiving position, and wherein the control unit further controls the first movable table and the second movable table and the first transferring device and the second transferring device so that the first movable table is controlled such that: the first movable table is moved from the first receiving position to the first sending position after printing of the preceding substrate is complete; the preceding substrate is sent from the first movable table to the first substrate unloading position caused by the transfer of the preceding substrate by the first transferring device; and the first movable table is moved to the first receiving position after sending the preceding substrate, the second movable table is controlled such that: the second movable table is moved from the second receiving position to the second sending position after printing of the preceding substrate is complete; the preceding substrate is sent from the second movable table to the second substrate unloading position caused by the transfer of the preceding substrate by the second transferring device; and the second movable table is moved to the second receiving position after sending the preceding substrate, wherein the move of the first movable table to the first sending position and move of the second movable table to the second sending position are alternately performed such that unloading of the substrate to the first substrate unloading position and unloading of the substrate to the second substrate unloading position are carried out alternately.

* * * * *